(12) United States Patent
Hashiguchi

(10) Patent No.: US 6,712,003 B2
(45) Date of Patent: Mar. 30, 2004

(54) SHEET MEMBER POSITIONING DEVICE AND IMAGE RECORDING DEVICE

(75) Inventor: Akihiro Hashiguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/251,786

(22) Filed: Sep. 23, 2002

(65) Prior Publication Data

US 2003/0056671 A1 Mar. 27, 2003

(30) Foreign Application Priority Data

Sep. 26, 2001 (JP) ........................................ 2001-293924
Sep. 26, 2001 (JP) ........................................ 2001-293925

(51) Int. Cl.$^7$ .......................... B41F 21/14; B65H 9/10
(52) U.S. Cl. ........................ 101/477; 101/485; 101/481; 271/238
(58) Field of Search .................. 271/238, 236, 271/245, 250; 101/477, 401.1, 474, 480, 481, 485, 486, DIG. 36; 400/579, 630, 632, 632.1, 633, 633.1, 647

(56) References Cited

U.S. PATENT DOCUMENTS

| 4,533,239 A | * | 8/1985 | Back ........................... 355/72 |
| 6,300,971 B1 | * | 10/2001 | Masotta et al. ............. 347/264 |
| 2003/0106448 A1 | * | 6/2003 | Uemura ....................... 101/477 |

* cited by examiner

Primary Examiner—Leslie J. Evanisko
(74) Attorney, Agent, or Firm—Sughrue Mion, PLLC

(57) ABSTRACT

In an automatic printing plate exposure device, when temporarily positioning a printing plate, a position of the printing plate in a temporary direction is determined by the printing plate abutting a pair of positioning pins. When actually positioning the printing plate in an exposure section, a position of the printing plate in an actual direction is determined by the printing plate abutting a pair of positioning pins. An angle of inclination in the temporary direction with respect to a front is set smaller than an angle of inclination in the actual direction. When positioning the printing plate, a position at which the printing plate abuts the pair of positioning pins and a reference pin, and a position at which the printing plate abuts the pair of positioning pins and the reference pin at a time of positioning in the exposure section, substantially coincide.

14 Claims, 9 Drawing Sheets

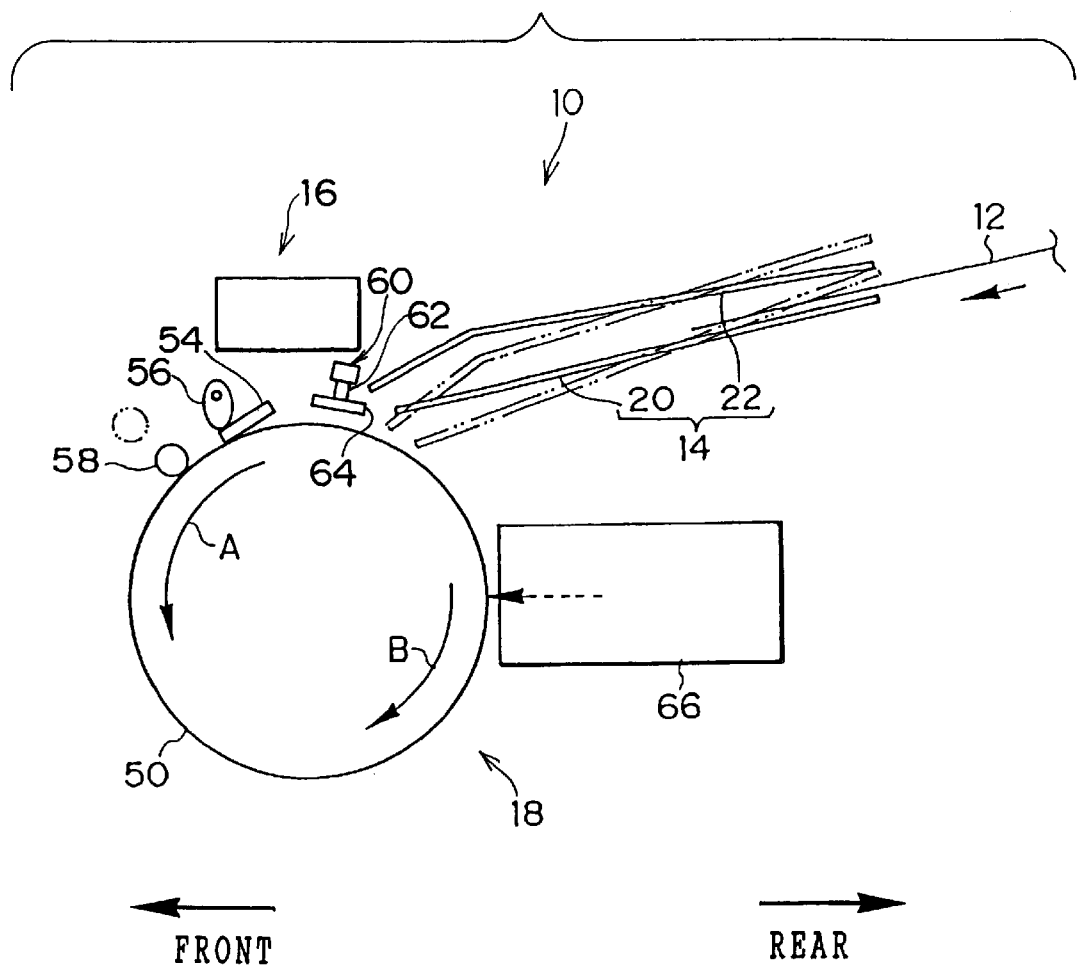

SHEET MEMBER POSITIONING DEVICE AND IMAGE RECORDING DEVICE

BACKGROUND OF THE INVENTION

1. Field of the Invention

The present invention relates to a device for positioning a sheet member in a state in which the sheet member is placed on a generally flat plate, and to a device for recording an image onto a printing plate.

2. Description of the Related Art

A printing plate exposure device has been developed which exposes and records an image directly by a laser beam or the like onto a photosensitive layer on a support of a sheet-shaped printing plate such as, for example, a photopolymer plate or a thermal plate. The photosensitive layer includes the emulsion surface of the printing plate.

In such a printing plate exposure device, the printing plate placed on a generally flat plate is, as needed, conveyed to a punching section, and is subjected to punching processing thereat. This punching processing is a processing for forming punch holes to be used for positioning the printing plate in printing processing which is a process to be carried out later. Further, the printing plate placed on the plate is conveyed to an exposure section, and exposure processing of the printing plate is carried out at the exposure section.

Here, before the punching processing in the punching section and the exposure processing in the exposure section, in order to improve the accuracy of the punching processing and the exposure processing, the printing plate must be positioned while being restrained or being held by pressure being applied thereto, in a state in which the printing plate is placed on the plate. Here, when the printing plate is restrained or held by the application of pressure, parameters, which enable the printing plate to be restrained or held by pressure such that it is difficult for the printing plate to buckle, are determined in advance by experimentation. On the basis of these parameters, the printing plate is restrained or is held by pressure being applied thereto.

The following is an example of positioning the printing plate while restraining or holding by pressure the printing plate which is in a state of being placed on a plate. Two first reference pins are provided at a side of the plate in one direction, which is the punching section side or the exposure section side of the plate. The printing plate is pushed by a first moving pin until the printing plate abuts the two first reference pins. The position of the printing plate in the one direction is thereby determined. Moreover, one second reference pin is provided at a side of the plate in another direction which is orthogonal to the aforementioned one direction. The printing plate is pushed by a second moving pin until the printing plate abuts the second reference pin. The position of the printing plate in this other direction is thereby determined.

There is also a method of positioning in which cut-outs are formed in the printing plate simultaneously with the punching processing in the punching section. With the first reference pins inserted into these cut-outs, positioning of the printing plate is carried out in the same manner as described above.

However, in such a printing plate exposure device, as described above, parameters, which make it difficult for the printing plate to buckle, are determined in advance by experimentation, and the printing plate is restrained or is held by pressure being applied thereto. Thus, there is the problem that the force of restraining the printing plate or the force of the holding by pressure of the printing plate is small, and the accuracy of positioning is unstable. The force of holding by pressure is, for example, the force of pushing the printing plate by the first moving pin and the second moving pin. The positioning accuracy being unstable means, for example, that the printing plate cannot reliably abut the first reference pins or the second reference pin. On the other hand, if the restraining force or the pressure holding force for holding the printing plate to the plate is increased, buckling deformation of the printing plate arises and the positioning accuracy deteriorates.

When cut-outs are formed in the printing plate, even if there is curving at the end surfaces of the printing plate, the printing plate can be accurately positioned. However, an expensive device for forming cut-outs is required, and the manufacturing costs thereby rise.

When two printing plate moving mechanisms are required such as in the case in which a first moving pin and a second moving pin are provided at the plate, the costs increase and the device becomes larger.

Before exposure processing at the exposure section, the printing plate is positioned in a state of being placed on the plate, and the exposure start position of the printing plate is determined. It is therefore necessary for the exposure position of the printing plate to coincide with the printing position of the printing plate determined by the punch holes.

Here, a first method for determining the exposure position of the printing plate is the following method. Simultaneously with the punching processing the punching section, cut-outs are formed in the printing plate. Insertion pins, which are fixed at the exposure section, are inserted into these cut-outs, and the printing plate is positioned. Further, on the basis of parameters set in advance for respective printing plate sizes, the exposure position of the printing plate is determined.

As a second method for determining the exposure position of the printing plate, there is a method in which end surfaces of a predetermined printing plate, which has been positioned in the exposure section by a method in which cut-outs are not formed in the printing plate, are detected optically. The exposure position of the printing plate is determined by computation from the results of detection.

However, in the above-described first method, there is the need to form cut-outs in the printing plate. Accordingly, an expensive device for forming cut-outs is required, and the device becomes expensive on the whole.

In the above-described second method, because the end surfaces of a printing plate curve slightly at each printing plate, the exposure position of the printing plate cannot be made to accurately coincide with the printing position. Thus, at the time of printing processing of the printing plate, the printing position must be made to match the exposure position by adjusting the printing position on the basis of the exposure position of the printing plate.

SUMMARY OF THE INVENTION

In view of the aforementioned, an object of the present invention is to provide a device for positioning a sheet member which can improve the accuracy of positioning a sheet member.

Another object of the present invention is to provide a device for positioning a sheet member and an image recording device which are low cost and in which, even if the end surfaces of a sheet member or a printing plate are curved, a position at which the sheet member or the printing plate is positioned by a first abutment member and a third abutment member, and a position at which the sheet member or the printing plate is positioned by a second abutment member and the third abutment member, can be made to coincide.

A first aspect of the present invention is a device for positioning a sheet member, the device comprising: a generally flat plate on which the sheet member is received; a conveying device provided so as to correspond to the sheet member received on the plate, and conveying the sheet member in the first direction; a temporary abutment member provided at a side of the plate in the first direction, and due to the sheet member, being conveyed in the first direction, the sheet member abutting the temporary abutment member at at least two points, which determines a position of the sheet member in a temporary direction; an actual abutment member provided at that side of the plate, and due to the sheet member being conveyed in the first direction after the position in the temporary direction has been determined, the sheet member abutting the actual abutment member at at least two points, which determines a position of the sheet member in an actual direction; a conveying force applying device applying a conveying force to the sheet member in the second direction substantially orthogonal to the first direction, to the sheet member; and a reference abutment member provided at another side of the plate in the second direction, and due to the conveying force in the second direction being applied to the sheet member, the sheet member abutting the reference abutment member, which determines a position of the sheet member in the second direction, wherein an angle of inclination of the temporary direction with respect to the first direction is $\alpha$, and an angle of inclination of the actual direction with respect to the first direction is $\beta$, $\alpha<\beta$.

In the device for positioning a sheet member of the first aspect of the present invention, the position of the sheet member in the temporary direction is determined by the conveying device conveying the sheet member on the plate in the first direction and the sheet member abutting the temporary abutment member at at least two points. The position of the sheet member in the actual direction is determined by the conveying device conveying, in the first direction, the sheet member after the position thereof in the temporary direction has been determined, and the sheet member abutting the actual abutment member at at least two points.

Due to conveying force in the other direction being applied to the sheet member by the conveying force applying device and the sheet member abutting the reference abutment member, the position of the sheet member in the other direction is determined.

In this way, due to the position of the sheet member in the actual direction and the other direction being determined, the sheet member is positioned in a state of being placed on the plate. This positioned state can be maintained by the force of conveying the sheet member by the conveying device and the conveying force applying device.

Here, given that an angle of inclination of the temporary direction with respect to the first direction is $\alpha$, and an angle of inclination of the actual direction with respect to the first direction is $\beta$, $\alpha<\beta$. Thus, the sheet member, which is being conveyed in the first direction after the position thereof in the temporary direction has been determined, first abuts the actual abutment member at one point and is pivoted. The sheet member thereby abuts the actual abutment member at at least two points, and the position of the sheet member in the actual direction is determined.

In this way, the sheet member is pivoted and abuts the actual abutment member at at least two points, and the sheet member abuts the reference abutment member due to the conveying force applying device. Thus, the sheet member can reliably abut the actual abutment member at at least two points, and can reliably abut the reference abutment member. The accuracy of positioning the sheet member can thereby be improved.

In the device for positioning a sheet member of the first aspect of the present invention, usually, before the sheet member abuts at least one of the temporary abutment member and the actual abutment member, the conveying device reduces a conveying speed of the sheet member.

In the device for positioning a sheet member of the present invention having such a conveying device, the conveying device reduces the conveying speed of the sheet member before the sheet member abuts at least one of the temporary abutment member and the actual abutment member. Thus, it is possible to suppress the moving away of the sheet member from the temporary abutment member or the actual abutment member due to the reaction of abutting the temporary abutment member or the actual abutment member. In this way, the sheet member can even more reliably abut the temporary abutment member and the actual abutment member, and the accuracy of positioning the sheet member can be improved even more.

A device for positioning a sheet member of a second aspect of the present invention comprises: a generally flat plate on which a sheet member is received; a conveying device provided so as to correspond to the sheet member received on the plate, and conveying the sheet member in one direction; a first temporary abutment member provided at a side of the plate in the first direction, and due to the sheet member being conveyed in the first direction, the sheet member abutting the first temporary abutment member at at least two points, which determines a position of the sheet member in a first temporary direction; a first actual abutment member provided at that side of the plate, and due to the sheet member being conveyed in the first direction after the position in the first temporary direction has been determined, the sheet member abutting the first actual abutment member at at least two points, which determines a position of the sheet member in a first actual direction; a second temporary abutment member provided at that side of the plate, and due to the sheet member being conveyed in the first direction after the position in the first actual direction has been determined, the sheet member abutting the second temporary abutment member at at least two points, which determines a position of the sheet member in a second temporary direction; a second actual abutment member provided at that side of the plate, and due to the sheet member, which is being conveyed in the first direction after the position in the second temporary direction has been determined, the sheet member abutting the second actual abutment member at at least two points, which determines a position of the sheet member in a second actual direction; a conveying force applying device applying a conveying force to the sheet member in the second direction, substantially orthogonal to the first direction; and a reference abutment member provided at another side of the plate in the second direction, and due to the conveying force in the second direction being applied to the sheet member, the sheet member abutting the reference abutment member, which determines a position of the sheet member in the second direction, wherein given that an angle of inclination of the first temporary direction with respect to the first direction is $\alpha 1$, an angle of inclination of the first actual direction with respect to the first direction is β1, an angle of inclination of the second temporary direction with respect to the first direction is α2, and an angle of inclination of the second actual direction with respect to the first direction is β2, when α1≠α2, α1<β1<α2<β2, and when α1=α2, α1<β1 and α2<β2.

In the device for positioning a sheet member of the second aspect of the present invention, the position of the sheet member in the first temporary direction is determined by the conveying device conveying the sheet member on the plate in the first direction and the sheet member abutting the first temporary abutment member at at least two points. Further, the position of the sheet member in the first actual direction is determined by the conveying device conveying, in the first direction, the sheet member after the position thereof in the first temporary direction has been determined, and the sheet member abutting the first actual abutment member at at least two points.

Moreover, the position of the sheet member in the second temporary direction is determined by the conveying device conveying, in the first direction, the sheet member after the position thereof in the first actual direction has been determined, and the sheet member abutting the second temporary abutment member at at least two points. In addition, the position of the sheet member in the second actual direction is determined by the conveying device conveying, in the first direction, the sheet member after the position thereof in the second temporary direction has been determined, and the sheet member abutting the second actual abutment member at at least two points.

The position of the sheet member in the other direction is determined by conveying force in the other direction being applied to the sheet member by the conveying force applying device, and the sheet member abutting the reference abutment member.

In this way, the position of the sheet member in the first actual direction and the other direction is determined, or the position of the sheet member in the second actual direction and the other direction is determined. Thus, in either case, the sheet member can be positioned in a state in which it is placed on the plate, and this positioned state can be maintained by the force of conveying the sheet member due to the conveying device and the conveying force applying device.

Here, given that an angle of inclination of the first temporary direction with respect to the first direction is α1, an angle of inclination of the first actual direction with respect to the first direction is β1, an angle of inclination of the second temporary direction with respect to the first direction is α2, and an angle of inclination of the second actual direction with respect to the first direction is β2, when α1≠α2, α1<β1<α2<β2, and when α1=α2, α1<β1 and α2<β2. Thus, the sheet member, which is being conveyed in the first direction after the position thereof in the first temporary direction has been determined, first abuts the first actual abutment member at one point and is pivoted. The sheet member thereby abuts the first actual abutment member at at least two points, and the position of the sheet member in the first actual direction is determined. Moreover, the sheet member, which is being conveyed in the first direction after the position thereof in the second temporary direction has been determined, first abuts the second actual abutment member at one point and is pivoted. The sheet member thereby abuts the second actual abutment member at at least two points, and the position of the sheet member in the second actual direction is determined.

In this way, the sheet member is pivoted, abuts the first actual abutment member and the second actual abutment member at at least two points, and abuts the reference abutment member due to the conveying force applying device. Thus, the sheet member can reliably abut the first actual abutment member and the second actual abutment member at at least two points, and can reliably abut the reference abutment member. The accuracy of positioning the sheet member can thereby be improved.

As described above, when α1≠α2, β1<α2. Thus, the sheet member, which is being conveyed in the first direction after the position thereof in the first actual direction has been determined, first abuts the second temporary abutment member at one point and is pivoted. The sheet member thereby abuts the second temporary abutment member at at least two points, and the position of the sheet member in the second temporary direction is determined. Thus, the sheet member can reliably abut the second temporary abutment member at at least two points. In this way, the sheet member can even more reliably abut the second actual abutment member at at least two points, and the accuracy of positioning the sheet member can be reliably improved.

In the device for positioning a sheet member of the second aspect of the present invention, usually, before the sheet member abuts at least one of the first temporary abutment member, the first actual abutment member, the second temporary abutment member, and the second actual abutment member, the conveying device reduces a conveying speed of the sheet member.

In the device for positioning a sheet member of the present invention having such a conveying device, the conveying device reduces the conveying speed of the sheet member before the sheet member abuts at least one of the first temporary abutment member, the first actual abutment member, the second temporary abutment member, and the second actual abutment member. Thus, it is possible to suppress the moving away of the sheet member from at least one of the first temporary abutment member, the first actual abutment member, the second temporary abutment member, or the second actual abutment member due to the reaction of the sheet member abutting that abutment member. In this way, the sheet member can even more reliably abut at least one of the first temporary abutment member, the first actual abutment member, the second temporary abutment member, and the second actual abutment member, and the accuracy of positioning the sheet member can be improved even more.

The devices for positioning a sheet member of the first and second aspects of the present invention which have been described above usually further comprise a conveying member provided at a side of the plate, in a direction substantially orthogonal to the temporary direction, and due to conveying member movement, the conveying member pushes the sheet member and conveys the sheet member in the second direction, and after the sheet member abuts the reference abutment member, the conveying member moves away from the sheet member.

In the device for positioning a sheet member having such a conveying member, due to the conveying member moving, the conveying member pushes the sheet member and conveys the sheet member in the other direction. Thus, the sheet member can be reliably conveyed in this other direction. Moreover, the conveying member moves apart from the sheet member after the sheet member has abutted the reference abutment member. Thus, the conveying member does not restrain the sheet member. In this way, buckling deformation of the sheet member can be prevented, and the positioning accuracy can be improved even more.

In the device for positioning a sheet member of the second aspect of the present invention, usually, a position, at which the sheet member abuts the first actual abutment member at at least two points and abuts the reference abutment member, and a position, at which the sheet member abuts the second actual abutment member at at least two points and abuts the reference abutment member, are the same position.

In the device for positioning a sheet member of the second aspect of the present invention which has such a feature, the position, at which the sheet member abuts the first actual abutment member at at least two points and abuts the reference abutment member, and the position, at which the sheet member abuts the second actual abutment member at at least two points and abuts the reference abutment member, are the same position. Thus, even if the end surfaces of the sheet member are curved, the position at which the sheet member is positioned by the first actual abutment member and the reference abutment member, and the position at which the sheet member is positioned by the second actual abutment member and the reference abutment member, can be made to coincide.

Moreover, the above-described two positions at which the sheet member is positioned can be made to coincide, even if cut-outs are not formed in the sheet member as in the conventional art. Thus, a conventional, expensive cut-out forming device is not needed, and the device can be made to be lower cost.

A device for positioning a sheet member of the third aspect of the present invention comprises: a generally flat plate on which the sheet member is received; a first conveying device provided so as to correspond to the sheet member received on the plate, and conveying the sheet member in a predetermined direction; a first abutment member provided at a side of the plate, in the predetermined direction, and due to the sheet member being conveyed in the predetermined direction, the sheet member abutting the first abutment member at at least two points, which determines a position of the sheet member in a first direction; a second abutment member provided at that side of the plate, and due to the sheet member being conveyed in the predetermined direction, abutting the second abutment member at at least two points, which determines a position of the sheet member in a second direction; a second conveying device which, when the sheet member abuts the first abutment member, conveys the sheet member in a third direction substantially orthogonal to the first direction, and which, when the sheet member abuts the second abutment member, conveys the sheet member in a fourth direction substantially orthogonal to the second direction; and a third abutment member provided at sides of the plate, in the third direction and the fourth direction, and due to the sheet member being conveyed in one of the third direction and the fourth direction, the sheet member abutting the third abutment member, which determines a position of the sheet member in one of the third direction and the fourth direction, wherein a position at which the sheet member abuts the first abutment member at at least two points and abuts the third abutment member, and a position at which the sheet member abuts the second abutment member at at least two points and abuts the third abutment member, are substantially the same position.

In the device for positioning a sheet member of the third aspect of the present invention, the position of the sheet member in the first direction is determined by the first conveying device conveying, in the predetermined direction, the sheet member which is on the plate, and the sheet member abutting the first abutment member at at least two points. Moreover, the position of the sheet member in the third direction (i.e., the direction orthogonal to the first direction) is determined by the second conveying device conveying the sheet member in the third direction, and the sheet member abutting the third abutment member. In this way, the sheet member is positioned by the first abutment member and the third abutment member in a state in which the sheet member is received on the plate.

Moreover, the position of the sheet member in the second direction is determined by the first conveying device conveying the sheet member in the predetermined direction, and the sheet member abutting the second abutment member at at least two points. In addition, the position of the sheet member in the fourth direction (i.e., the direction orthogonal to the second direction) is determined by the second conveying device conveying the sheet member in the fourth direction, and the sheet member abutting the third abutment member. In this way, the sheet member is positioned by the second abutment member and the third abutment member in the state in which the sheet member is received on the plate.

Here, the position, at which the sheet member abuts the first abutment member at at least two points and abuts the third abutment member, and the position, at which the sheet member abuts the second abutment member at at least two points and abuts the third abutment member, are the same position. Thus, even if the end surfaces of the sheet member are curved, the position, at which the sheet member is positioned by the first abutment member and the third abutment member, and the position, at which the sheet member is positioned by the second abutment member and the third abutment member, can be made to coincide.

Moreover, the above-described two positions at which the sheet member is positioned can be made to coincide, even if cut-outs are not formed in the sheet member as in the conventional art. Thus, a conventional, expensive cut-out forming device is not needed, and the device can be made to be lower cost.

An image recording device of the fourth aspect of the present invention comprises: a generally flat plate on which a printing plate is received; a first conveying device provided so as to correspond to the printing plate received on the plate, and conveying the printing plate in a predetermined direction; a first abutment member provided at a side of the plate, in the predetermined direction, and due to the printing plate being conveyed in the predetermined direction, the printing plate abutting the first abutment member at at least two points, which determines a position of the printing plate in a first direction; a second abutment member provided at the side of the plate, and due to the printing plate being conveyed in the predetermined direction, the printing plate abutting the second abutment member at at least two points, which determines a position of the printing plate in a second direction; a second conveying device which, when the printing plate abuts the first abutment member, conveys the printing plate in a third direction substantially orthogonal to the first direction, and which, when the printing plate abuts the second abutment member, conveys the printing plate in a fourth direction substantially orthogonal to the second direction; a third abutment member provided at sides of the plate, in the third direction and the fourth direction, and due to the printing plate being conveyed in one of the third direction and the fourth direction, abutting the third abutment member after the third abutment member has moved from a starting point position in accordance with a size of the printing plate, which determines a position of the printing plate in one of the third direction and the fourth direction; and an image recording section provided so as to be movable from an origin position, and recording an image on the printing plate which has been positioned by abutting the second abutment member at at least two points and by abutting the third abutment member, wherein a position at which the printing plate abuts the first abutment member at at least two points and abuts the third abutment member, is substantially the same as where the printing plate abuts the second abutment member at at least two points and abuts the third abutment member, and an image recording start position of the printing plate is determined by computing an initial movement distance of the image recording section from the origin position, in accordance with a distance which the third abutment member has moved from the starting point position in accordance with the size of the printing plate.

In the image recording device of the fourth aspect of the present invention, the position of the printing plate in the first direction is determined by the first conveying device conveying, in the predetermined direction, the printing plate which is on the plate, and the printing plate abutting the first abutment member at at least two points. Moreover, the position of the printing plate in the third direction (i.e., the direction orthogonal to the first direction) is determined by the second conveying device conveying the printing plate in the third direction, and the printing plate abutting the third abutment member which has moved from its starting point position in accordance with the size of the printing plate. In this way, the printing plate is positioned by the first abutment member and the third abutment member in a state in which the printing plate is received on the plate.

The position of the printing plate in the second direction is determined by the first conveying device conveying the printing plate in the predetermined direction and the printing plate abutting the second abutment member at at least two points. Further, the position of the printing plate in the fourth direction (i.e., the direction orthogonal to the second direction) is determined by the second conveying device conveying the printing plate in the fourth direction, and the printing plate abutting the third abutment member which has moved from its starting point position in accordance with the size of the printing plate. In this way, the printing plate is positioned by the second abutment member and the third abutment member in a state in which the printing plate is received on the plate.

Moreover, the image recording section, which can move from its origin position, records an image on the printing plate which has been positioned by the second abutment member and the third abutment member.

Here, the position, at which the printing plate abuts the first abutment member at at least two points and abuts the third abutment member, and the position, at which the printing plate abuts the second abutment member at at least two points and abuts the third abutment member, are the same position. Thus, even if there is curving at the end surfaces of the printing plate, the position, at which the printing plate is positioned by the first abutment member and the third abutment member, and the position, at which the printing plate is positioned by the second abutment member and the third abutment member, can be made to coincide with each other.

Moreover, the above-described two positions at which the printing plate is positioned can be made to coincide, even if cut-outs are not formed in the printing plate as in the conventional art. Thus, a conventional, expensive cut-out forming device is not needed, and the device can be made to be lower cost.

Here, the image recording start position of the printing plate is determined by computing an initial moving distance of the image recording section from its origin position, in accordance with a distance which the third abutment member has moved from its starting point position in accordance with the size of the printing plate. Thus, the image recording start position of the printing plate can be determined accurately.

In the image recording device of the fourth aspect of the present invention, usually, punch holes, which are used in positioning for printing processing of the printing plate, are formed in the printing plate which has been positioned by abutting the first abutment member at at least two points and by abutting the third abutment member.

Usually, in the image recording device of the fourth aspect of the present invention, punch holes, which are used in positioning for printing processing of the printing plate, are formed in the printing plate which has been positioned by the first abutment member and the third abutment member. Further, as described above, the position at which the printing plate is positioned by the first abutment member and the third abutment member (the position at which the printing plate is positioned for punch hole punching), and the position at which the printing plate is positioned by the second abutment member and the third abutment member (the position at which the printing plate is positioned for image recording) coincide with one another. Thus, the image recording position of the printing plate can be made to coincide with the printing position of the printing plate determined by the punch holes.

BRIEF DESCRIPTION OF THE DRAWINGS

FIG. 2 is a schematic side view showing the automatic printing plate exposure device relating to the embodiment of the present invention.

DESCRIPTION OF THE PREFERRED EMBODIMENTS

Figure 1:
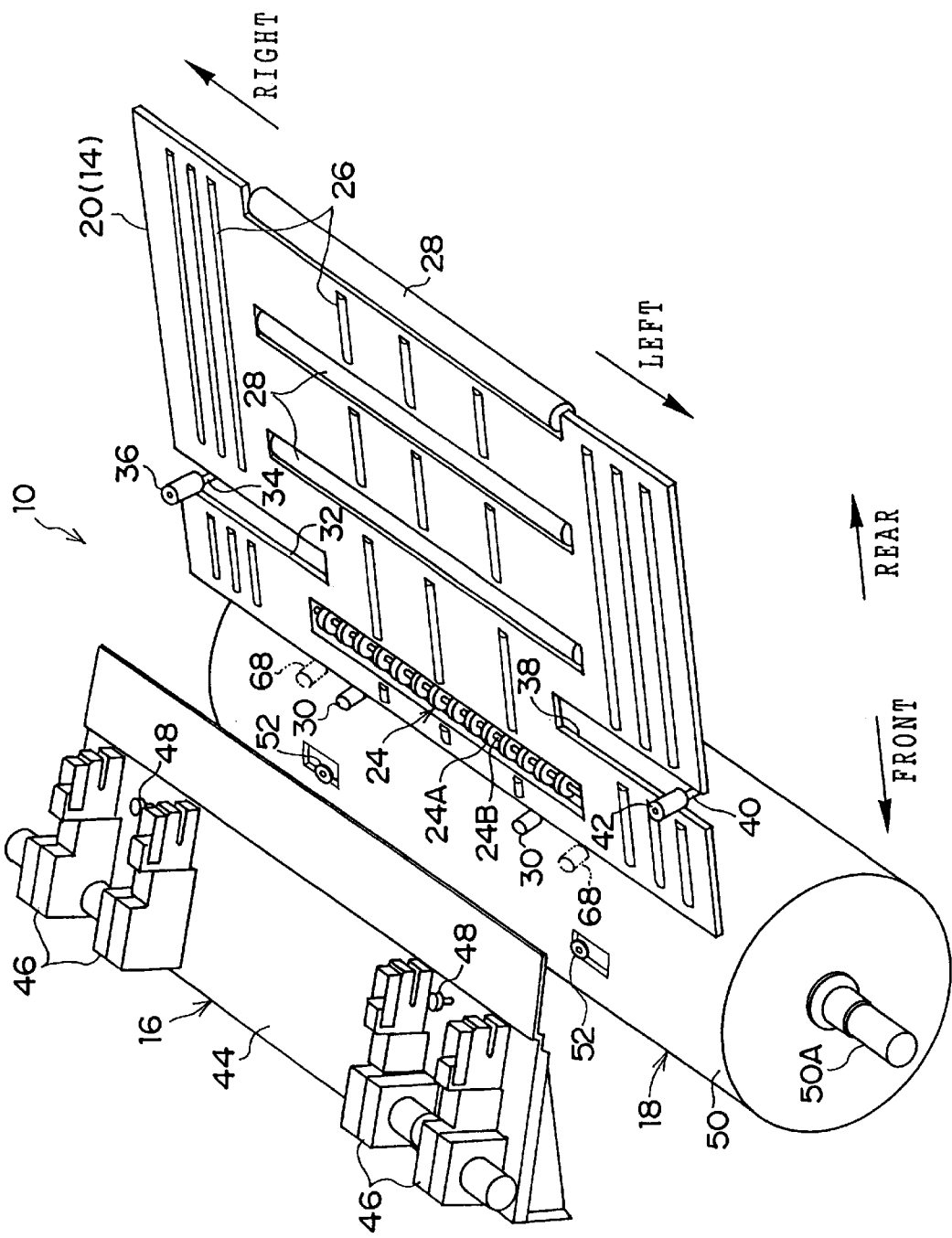
FIG. 1 is a schematic perspective view showing an automatic printing plate exposure device relating to an embodiment of the present invention.

FIG. 2 is a side view of an automatic printing plate exposure device 10 relating to the present embodiment, and structured such that the device for positioning a sheet member and the image recording device of the present invention are applied thereto.

The automatic printing plate exposure device 10 relating to the present embodiment is a device which exposes (records) an image onto an image forming layer (a photosensitive layer, an emulsion surface) on a support of a printing plate 12 which serves as a sheet member and is a photo-poly plate, a thermal plate, or the like. The automatic printing plate exposure device 10 is divided into a conveying guide unit 14, a punching section 16, and an exposure section 18. The punching section 16 and the exposure section 18 are provided ahead of the conveying guide unit 14, and the exposure section 18 is disposed beneath the punching section 16.

The conveying guide unit 14 includes a plate supplying guide 20 which serves as a plate and is a substantially rectangular flat-plate shape, and a plate discharging guide 22 which is a substantially rectangular flat-plate shape. The relative positional relationship of plate supplying guide 20 and the plate discharging guide 22 is such that the guides 20, 22 are disposed to form a sideways V-shape. The conveying guide unit 14 rotates a predetermined angle around a vicinity of the center of FIG. 2. Due to this rotation, the plate supplying guide 20 and the plate discharging guide 22 can be selectively made to correspond to the punching section 16 or the exposure section 18.

As shown in FIG. 1, a conveying roller 24 which serves as a conveying device is rotatably provided at the front side region of the plate supplying guide 20. The conveying roller 24 is formed by a plurality of solid cylindrical roller portions 24A formed of silicon rubber being aligned at and skewered by a rotating central shaft 24B. The conveying roller 24 projects above the plate supplying guide 20. Due to the conveying roller 24 being driven to rotate, the printing plate 12 received on the plate supplying guide 20 is conveyed forward (in one direction) by conveying force in a direction orthogonal to the rotating central shaft 24B of the conveying roller 24 (in the direction of arrow C in FIG. 4) being applied to the printing plate 12. Further, the rotating central shaft 24B of the conveying roller 24 serves as a conveying force applying device, and is disposed at an incline such that the right end portion thereof is further rearward then the left end portion thereof. In this way, conveying force toward the right can be applied to the printing plate 12 by the component of force (arrow D in FIG. 4), toward the right (the other direction), of the conveying force of the conveying roller 24.

A predetermined number of ribs 26, which are formed in trapezoidal column shapes, are provided on the plate supplying guide 20. The ribs 26 are disposed parallel to the front-back direction. The height by which the ribs 26 project out above the plate supplying guide 20 is slightly lower than that of the conveying roller 24. A predetermined number of cylindrical rotating rollers 28 are provided on the plate supplying guide 20 so as to be freely rotatable. The rotating rollers 28 are disposed parallel to the left-right direction (or may be parallel to the rotating central shaft 24B of the conveying roller 24). The height by which the rotating rollers 28 project out above the plate supplying guide 20 is substantially the same as that of the conveying roller 24. Here, due to the rotation of the rotating rollers 28 which accompanies the supporting of the printing plate 12 onto the ribs 26 and the conveying of the printing plate 12, the frictional force at the time of conveying the printing plate 12 can be reduced.

Figure 3A:
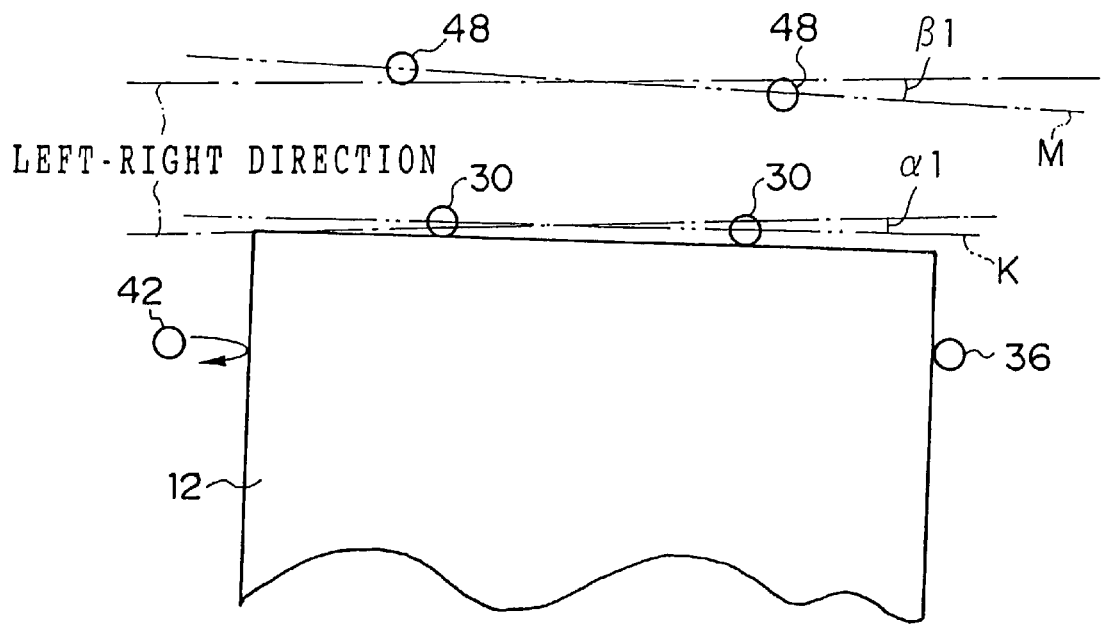
FIG. 3A is a plan view showing a state in which a printing plate is being positioned for punching processing, in the automatic printing plate exposure device relating to the embodiment of the present invention.

A pair of positioning pins 30, which serve as a first temporary abutment member (temporary abutment member), are provided at the front end of the plate supplying guide 20 along a first temporary inclined line K (see FIG. 3A) which is inclined with respect to the left-right direction. The positioning pins 30 are formed as cylinders, are freely rotatable around central shafts, and project out with respect to the top surface of the plate supplying guide 20. When the printing plate 12 which is received on the plate supplying guide 20 is conveyed forward by the conveying roller 24, the front end of the printing plate abuts the right side positioning pin 30, and the printing plate 12 is pivoted. The front end of the printing plate 12 thereby abuts the pair of positioning pins 30, and the position of the printing plate 12 in the first temporary direction (a direction orthogonal to the first temporary inclined line K) is determined.

Figure 3B:
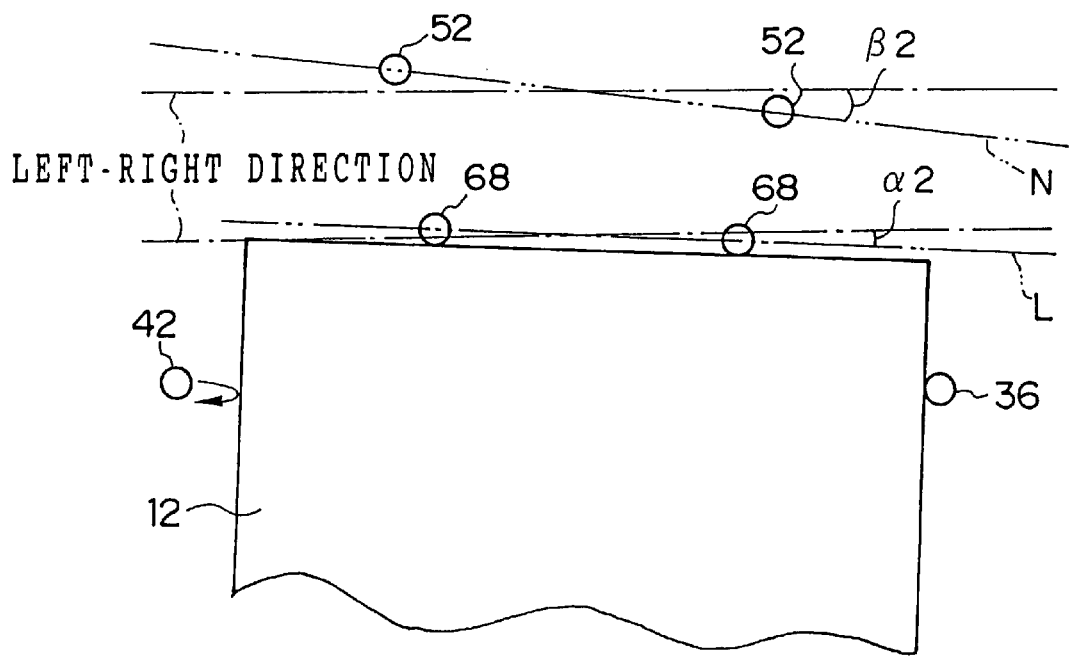
FIG. 3B is a plan view showing a state in which the printing plate is being positioned for exposure processing, in the automatic printing plate exposure device relating to the embodiment of the present invention.

A pair of positioning pins 68, which serve as a second temporary abutment member (temporary abutment member), are provided at the front end of the plate supplying guide 20 along a second temporary inclined line L (see FIG. 3B) which is inclined with respect to the left-right direction. The positioning pins 68 are formed as cylinders, are freely rotatable around central shafts, and project out with respect to the top surface of the plate supplying guide 20. When the printing plate 12 is returned to the plate supplying guide 20 from the punching section 16 as will be described later, the pair of positioning pins 68 are projected out with respect to the top surface of the plate supplying guide 20. In this way, the front end of the printing plate 12 which is being conveyed forward by the conveying roller 24 abuts the right side positioning pin 68, and the printing plate 12 is pivoted. The front end of the printing plate 12 thereby abuts the pair of positioning pins 68, and the position of the printing plate 12 in the second temporary direction (a direction orthogonal to the second temporary inclined line L) is determined.

Before the printing plate 12 is pivoted and abuts the left side positioning pin 30 or 68 (this is also applicable to before the printing plate 12 abuts a left side positioning pin 48 or a left side positioning pin 52 which will be described later), the conveying speed of the printing plate 12 by the conveying roller 24 (the rotating speed of the conveying roller 24) is lowered.

The pairs of positioning pins 30, 68 can be lowered from the top surface of the plate supplying guide 20. In this way, the printing plate 12 can, by the conveying roller 24, pass over the front end of the plate supplying guide 20 and be conveyed forward.

A slit 32 is formed in the right side region of the plate supplying guide 20 in a vicinity behind the conveying roller 24. The slit 32 is disposed parallel to the left-right direction, and a supporting shaft 34 passes through the interior thereof. A cylindrical reference pin 36, which serves as a reference abutment member or the third abutment member, is supported at the top portion of the supporting shaft 34 so as to be freely rotatable around the supporting shaft 34. Due to the supporting shaft 34 moving along the slit 32 and the reference pin 36 being moved in the left-right direction, the reference pin 36 is disposed at a position which is determined in advance in accordance with the size of the printing plate 12 which is received on the plate supplying guide 20.

A slit 38 is formed in the left side region of the plate supplying guide 20 in a vicinity behind the conveying roller 24. The slit 38 is disposed parallel to the left-right direction, and a supporting shaft 40 passes through the interior thereof. A cylindrical conveying pin 42, which serves as a conveying member, is supported at the top portion of the supporting shaft 40 so as to be freely rotatable around the supporting shaft 40. Here, at the time when the position of the printing plate 12 in the first temporary direction or the second temporary direction is determined as described above, the supporting shaft 40 is moved to the right along the slit 38 and the conveying pin 42 is moved. The conveying pin 42 thereby pushes the printing plate 12 and conveys the printing plate 12 toward the right, such that the printing plate 12 abuts the reference pin 36. In this way, the position of the printing plate 12 in the right direction is determined, and the printing plate 12 is temporarily positioned. Note that the left-right direction central portion of the front end of the printing plate 12 which is temporarily positioned in this way, coincides with the left-right direction central portion of the plate supplying guide 20.

After the printing plate 12 abuts the reference pin 36, the conveying pin 42 always moves apart from the printing plate 12. Further, even after the printing plate 12 has been positioned in this way (temporarily positioned, as well as actually positioned as will be described later), the conveying roller 24 is rotated intermittently. In this way, the positioned state of the printing plate 12 is maintained by the conveying force of the conveying roller 24 and the component of force toward the right of this conveying force. Note that buckling of the printing plate 12 due to the pushing force of the conveying pin 42 may be prevented by structuring the supporting shaft 40 to be able to move while still in the state of applying a predetermined elastic force toward the reference pin 36 side.

The punching section 16 has a flat-plate-shaped supporting plate 44. A predetermined number of punching devices 46 are supported on the supporting plate 44. In the present embodiment, a pair of punching devices 46 is provided at each of the left and the right, for a total of four punching devices 46. Here, after the printing plate 12 is temporarily positioned by the pair of positioning pins 30 and the reference pin 36 as described above, the conveying guide unit 14 is rotated such that the plate supplying guide 20 corresponds to the punching section 16, i.e., opposes the punching devices 46. Further, by lowering the pair of positioning pins 30 from the top surface of the plate supplying guide 20, the front end portion of the printing plate 12 can be conveyed by the conveying roller 24 from the plate supplying guide 20 into the punching devices 46. At this time, the state of the printing plate 12 abutting the reference pin 36 is maintained by the component of force, toward the right, of the conveying force of the conveying roller 24.

Figure 4:
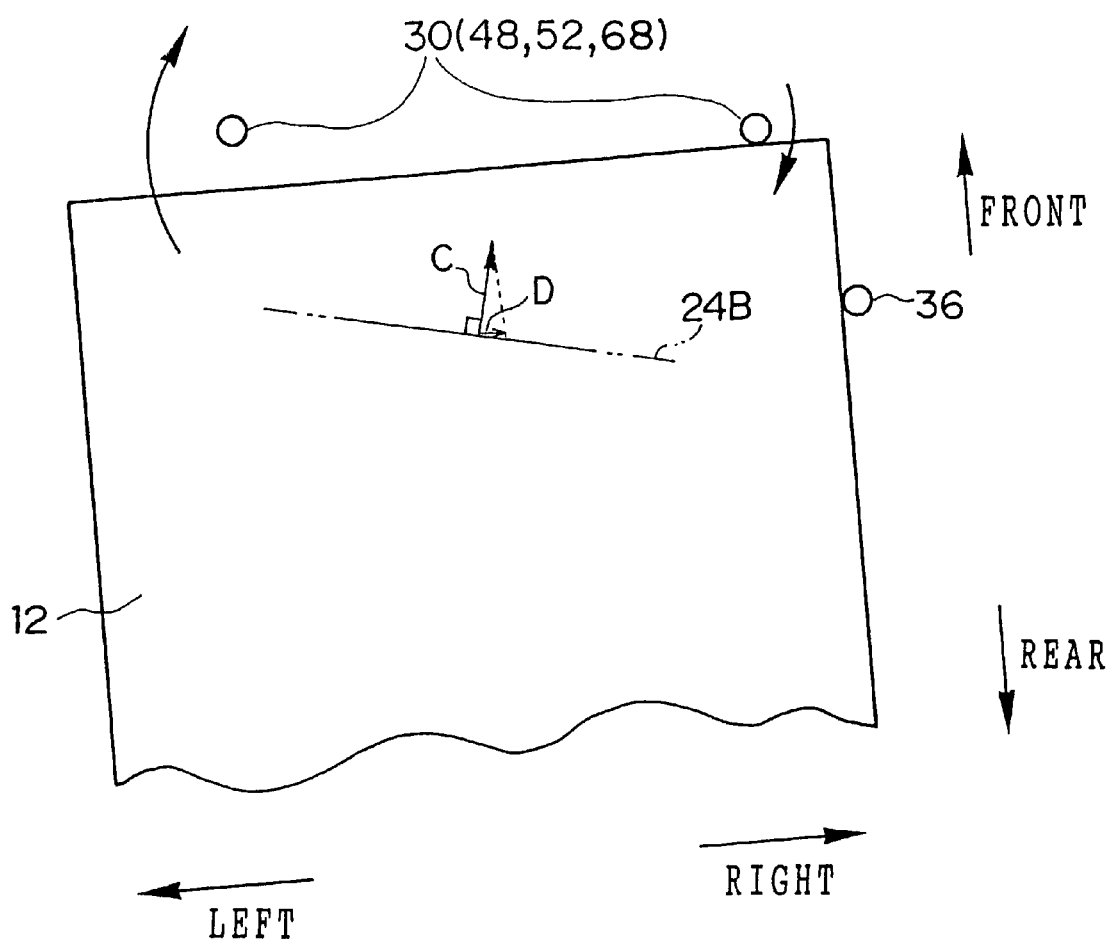
FIG. 4 is a plan view showing a state in which the printing plate is rotated while abutting a right side positioning pin and a reference pin, in the automatic printing plate exposure device relating to the embodiment of the present invention.
Figure 5:
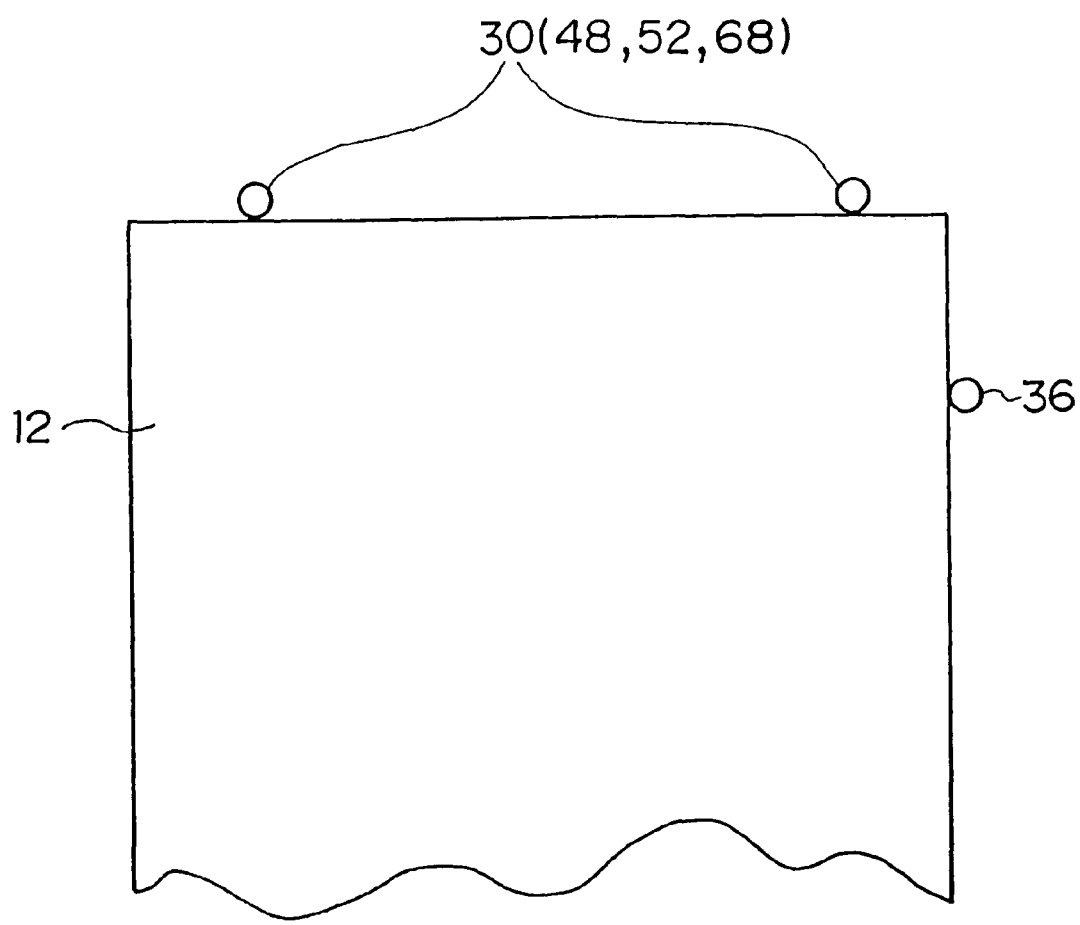
FIG. 5 is a plan view showing a state in which the printing plate is positioned in the automatic printing plate exposure device relating to the embodiment of the present invention.

A positioning pin 48, which serves as a first actual abutment member (actual abutment member) is provided between the two punching devices 46 of each pair of punching devices 46. This pair of positioning pins 48 is disposed along a first actual inclined line M (see FIG. 3A) which is inclined with respect to the left-right direction. Each positioning pin 48 is cylindrical, and rotates freely around a central shaft. The left-right direction central portion of the pair of positioning pins 48 coincides with the left-right direction central portion of the plate supplying guide 20. The front end of the printing plate 12 conveyed into the punching devices 46 abuts the right side positioning pin 48, and as shown in FIG. 4, the printing plate 12 pivots while its state of abutting the right side positioning pin 48 and the reference pin 36 is maintained, and as shown in FIG. 5, the printing plate 12 abuts the left side positioning pin 48. In this way, at the punching section 16, the position of the printing plate 12 in the first actual direction (the direction orthogonal to the first actual inclined line M) and the right direction is determined, and actual positioning of the printing plate 12 is carried out. Note that the left-right direction central portion of the printing plate 12 which is actually positioned in this way coincides with the left-right direction central portion of the pair of positioning pins 48.

A predetermined number of punch holes (not shown), which are, for example, round holes or elongated holes or the like, are formed by the punching devices 46 in the front end portion of the printing plate 12 which is actually positioned in this way. The predetermined number of punch holes serve as a reference for winding the printing plate 12 onto a plate cylinder of a rotary press of a printing device (not shown) on which the printing plate 12 is conveyed, and are used in positioning the printing plate 12 for the printing processing at the printing device. When the processing at the punching devices 46 is completed, by rotating the conveying roller 24 reversely, the printing plate 12 is returned onto the plate supplying guide 20. The pair of positioning pins 68 are projected from the top surface of the plate supplying guide 20, and the printing plate 12 is temporarily positioned as described above.

The exposure section 18 is equipped with a cylindrical rotating drum 50. The rotating drum 50 is disposed parallel to the left-right direction, and can rotate in the direction of arrow A and the direction of arrow B in FIG. 2. Here, when the printing plate 12, which has returned onto the plate supplying guide 20 from the punching section 16, is temporarily positioned as mentioned above, the conveying guide unit 14 is rotated such that the plate supplying guide 20 corresponds to the exposure section 18, i.e., opposes the rotating drum 50 in a direction tangent to the rotating drum 50. By lowering the pair of positioning pins 68 from the top surface of the plate supplying guide 20, the front end of the printing plate 12 is conveyed by the conveying roller 24 onto the peripheral surface of the rotating drum 50. At this time, the state of the printing plate 12 abutting the reference pin 36 is maintained by the component of force, toward the right, of the conveying force of the conveying roller 24.

A pair of positioning pins 52, which serve as a second actual abutment member (actual abutment member) are provided at the peripheral surface of the rotating drum 50. The pair of positioning pins 52 is disposed along a second actual inclined line N (see FIG. 3B) which is inclined with respect to the left-right direction. Each positioning pin 52 is cylindrical, and rotates freely around a central shaft. The front end of the printing plate 12 conveyed onto the peripheral surface of the rotating drum 50 abuts the pair of positioning pins 52, and as shown in FIG. 4, the printing plate 12 pivots while its state of abutting the right side positioning pin 52 and the reference pin 36 is maintained, and as shown in FIG. 5, the printing plate 12 abuts the left side positioning pin 52. In this way, at the exposure section 18, the position of the printing plate 12 in the second actual direction (the direction orthogonal to the first actual inclined line N) and the right direction is determined, and actual positioning of the printing plate 12 is carried out. The positions at which the pair of positioning pins 52 are disposed correspond, in the front-back direction and the left-right direction, to the positions at which the pair of positioning pins 48 are disposed. The position where the printing plate 12, which is actually positioned in the punching section 16, abuts the pair of positioning pins 48 and the reference pin 36, and the position where the printing plate 12, which is actually positioned in the exposure section 18, abuts the pair of positioning pins 52 and reference pin 36, are the same position.

As shown in FIG. 2, a plate-shaped front end pressing portion 54 is provided, in a vicinity of the pair of positioning pins 52, at the peripheral surface of the rotating drum 50. The front-back direction substantially central portion of the front end pressing portion 54 is pivotably supported at the rotating drum 50. Elastic force, in a direction of moving away from the peripheral surface of the rotating drum 50, is applied to the front side of the front end pressing portion 54.

An attaching cam 56 is provided above the front end pressing portion 54. Due to the attaching cam 56 pushing the front side of the front end pressing portion 54, the rear side of the front end pressing portion 54 moves apart from the peripheral surface of the rotating drum 50. In this way, the front end of the printing plate 12, which is conveyed onto the peripheral surface of the rotating drum 50 from the plate supplying guide 20 as described above, is inserted between the rear side of the front end pressing portion 54 and the peripheral surface of the rotating drum 50, and in this state, the above-described actual positioning of the printing plate 12 is carried out. Further, after the above-described actual positioning of the printing plate 12 has been completed, by rotating the attaching cam 56 so as to release the pushing of the front side of the front end pressing portion 54, the rear side of the front end pressing portion 54 presses the front end of the printing plate 12 by the aforementioned elastic force, and the front end of the printing plate 12 is held at the peripheral surface of the rotating drum 50. When the front end of the printing plate 12 is held at the peripheral surface of the rotating drum 50, the rotating drum 50 is rotated in the direction of arrow A in FIG. 2, and the printing plate 12 is taken up onto the peripheral surface of the rotating drum 50.

A squeeze roller 58 is disposed in a vicinity of the peripheral surface of the rotating drum 50, at the arrow A direction side of the attaching cam 56. Due to the squeeze roller 58 moving toward the rotating drum 50, the printing plate 12 wound on the rotating drum 50 is rotated while being pressed toward the rotating drum 50, such that the printing plate 12 is tightly fit against the peripheral surface of the rotating drum 50.

A rear end pressing portion attaching/removing unit 60 is disposed between the attaching cam 56 and the conveying guide unit 14 in a vicinity of the peripheral surface of the rotating drum 50. The rear end pressing portion attaching/removing unit 60 has a shaft 62. The shaft 62 is movable toward the rotating drum 50. A rear end pressing portion 64 is mounted to the distal end of the shaft 62. When the rear end of the printing plate 12 wound on the rotating drum 50 opposes the rear end pressing portion attaching/removing unit 60, the shaft 62 moves the rear end pressing portion 64 toward the rotating drum 50, and attaches the rear end pressing portion 64 to a predetermined position of the rotating drum 50. Simultaneously, the rear end pressing portion 64 separates from the shaft 62. In this way, the rear end pressing portion 64 presses the rear end of the printing plate 12 such that the rear end of the printing plate 12 is held at the peripheral surface of the rotating drum 50.

In this way, when the front end and the rear end of the printing plate 12 are held at the rotating drum 50 by the front end pressing portion 54 and the rear end pressing portion 64, the squeeze roller 58 moves away from the rotating drum 50. Thereafter, the rotating drum 50 is rotated at high speed at a predetermined rotational speed.

A recording head portion 66 is disposed in a vicinity of the peripheral surface of the rotating drum 50. Synchronously with the rotating of the rotating drum 50, the recording head portion 66 irradiates a light beam, which is modulated on the basis of read image data, toward the rotating drum 50 which is rotating at high speed. The printing plate 12 is thereby exposed on the basis of the image data. This exposure processing is so-called scanning-exposure in which, while the rotating drum 50 is rotating at high speed, i.e., while main scanning is carried out, the recording head portion 66 moves in the axial direction of the rotating drum 50, i.e., subscanning is carried out. At this time, the position of the start of exposure (recording) of the printing plate 12, i.e., the position of the start of drawing the image of the printing plate 12, is determined by computation in accordance with the distance of movement at the time when the reference pin 36 has moved from its initial position in order to position the printing plate 12. In the present embodiment, the initial position is the right edge of the plate supplying guide 20. Moreover, the rotational position of the rotating drum 50 is judged by computing rotational position data by an encoder (not shown) disposed on a rotating shaft 50A of the rotating drum 50.

When the scan-exposure of the printing plate 12 is completed, the rotating drum 50 is temporarily stopped at the position where the rear end pressing portion 64 opposes the shaft 62. The rear end pressing portion 64 is removed from the rotating drum 50 by the shaft 62. Namely, the rear end pressing portion 64 is attached to the shaft 62, and the pressing of the rear end of the printing plate 12 by the rear end pressing portion 64 is released. Moreover, after the conveying guide unit 14 is rotated such that the plate discharging guide 22 corresponds to the exposure section 18, i.e., after the conveying guide unit 14 is rotated such that the plate discharging guide 22 opposes the rotating drum 50 in a direction tangential to the rotating drum 50, the rotating drum 50 is rotated in the direction of arrow B in FIG. 2. The printing plate 12 is thereby discharged from the rear end side thereof to the plate discharging guide 22. At this time, due to the attaching cam 56 being rotated and pushing the front side of the front end pressing portion 54, the pressing of the front end of the printing plate 12 by the rear side of the front end pressing portion 54 is released. Further, when the printing plate 12 is sent into the plate discharging guide 22, the conveying guide unit 14 is rotated, and the printing plate 12 is discharged from the plate discharging guide 22. The printing plate 12 is thereby conveyed to a developing device or a printing device (both not shown) which is the subsequent process adjacent the automatic printing plate exposure device 10.

Next, operation of the present embodiment will be described.

First, the printing plate 12 is received on the plate supplying guide 20. At this time, the printing plate 12 may be fed-in by so-called manual feeding, or may be fed-in by an automatic plate feeding device or the like.

The printing plate 12 on the plate supplying guide 20 is received in a state in which the received position and the inclination and the like of the printing plate 12 with respect to the plate supplying guide 20 are relatively rough. In this state, the printing plate 12 is conveyed forward by the conveying roller 24 such that the front end of the printing plate 12 abuts the pair of positioning pins 30, and the printing plate 12 is conveyed rightward by the conveying pin 42 so as to abut the reference pin 36. The printing plate 12 is thereby temporarily positioned.

In this temporarily positioned state, when the conveying guide unit 14 is pivoted such that the plate supplying guide 20 is made to correspond to the punching section 16, and the pair of positioning pins 30 are lowered from the top surface of the plate supplying guide 20, the printing plate 12 is conveyed forward by the conveying roller 24, and the front end of the printing plate 12 abuts the right side positioning pin 48 of the punching section 16. In this way, the printing plate 12 is pivoted while the state of abutting the right side positioning pin 48 and the reference pin 36 is maintained, and abuts the left side positioning pin 48. The printing plate 12 is thereby actually positioned at the punching section 16. A predetermined number of punch holes are formed by the punching devices 46 in the front end of the printing plate 12 which has been actually positioned in this way. Thereafter, due to the conveying roller 24 rotating reversely, the printing plate 12 is returned onto the plate supplying guide 20, and the pair of positioning pins 68 are made to project from the top surface of the plate supplying guide 20. At this time, the printing plate 12 is conveyed forward by the conveying roller 24, the front end of the printing plate 12 abuts the pair of positioning pins 68, and the printing plate 12 is conveyed rightward by the conveying pin 42 and abuts the reference pin 36. The printing plate 12 is thereby temporarily positioned.

In this temporarily positioned state, when the conveying guide unit 14 is pivoted such that the plate supplying guide 20 corresponds to the exposure section 18, and the pair of positioning pins 68 are lowered from the top surface of the plate supplying guide 20, the printing plate 12 is conveyed forward by the conveying roller 24, and the front end of the printing plate 12 abuts the right side positioning pin 52 of the rotating drum 50. In this way, the printing plate 12 is pivoted while the state of the printing plate 12 abutting the right side positioning pin 52 and the reference pin 36 is maintained, and the printing plate 12 abuts the left side positioning pin 52. The printing plate 12 is thereby actually positioned at the exposure section 18. The printing plate 12, which has been actually positioned in this way, is wound onto the peripheral surface of the rotating drum 50, while the front end and the rear end of the printing plate 12 are held on the peripheral surface of the rotating drum 50 by the front end pressing portion 54 and the rear end pressing portion 64 respectively and the printing plate 12 is made to fit tightly to the peripheral surface of the rotating drum 50 by the squeeze roller 58. Thereafter, the rotating drum 50 is rotated at high speed, and exposure processing by the recording head portion 66 is carried out.

When exposure processing is completed, the conveying guide unit 14 is pivoted such that the plate discharging guide 22 corresponds to the rotating drum 50. While the holding of the printing plate 12 on the peripheral surface of the rotating drum 50 by the front end pressing portion 54 and the rear end pressing portion 64 is released, the printing plate 12 is discharged from the rotating drum 50 to the plate discharging guide 22. Thereafter, the conveying guide unit 14 is pivoted, and the printing plate 12 is conveyed from the plate discharging guide 22 to a developing device or a printing device.

Here, at the time when the printing plate 12 is temporarily positioned and at the time when the printing plate 12 is actually positioned at the punching section 16 and the exposure section 18, by rotating the conveying roller 24, conveying force in a direction orthogonal to the rotating central shaft 24B is applied to the printing plate 12, and the printing plate 12 is conveyed forward on the plate supplying guide 20 due to substantially static frictional force. Due to the printing plate 12 abutting the pairs of positioning pins 30, 48, 52, 68, the position of the printing plate 12 in the first temporary direction, the second temporary direction, the first actual direction, and the second actual direction, respectively, is determined.

Moreover, the rotating central shaft 24B of the conveying roller 24 is inclined with respect to the right direction. Therefore, conveying force toward the right is applied to the printing plate 12 due to the kinetic frictional force arising due to the rotation of the conveying roller 24. The kinetic frictional force is the rightward component of force of the conveying force of the conveying roller 24. Further, the position of the printing plate 12 in the rightward direction is determined by the printing plate 12 abutting the reference pin 36.

In this way, the printing plate 12 can be positioned in a state in which it is received on the plate supplying guide 20. Further, the positioned state of the printing plate 12 can be maintained by the conveying force of the conveying roller 24 and the component of force, in the rightward direction, of this conveying force.

Due to the conveying pin 42 moving, the printing plate 12 is pushed and conveyed rightward. Thus, the printing plate 12 can reliably be conveyed toward the right.

Here, as shown in FIG. 3, the angle of inclination of the first temporary direction with respect to the front, which is the same as the angle of inclination of the first temporary inclined line K with respect to the left-right direction, is $\alpha 1$. The angle of inclination of the first actual direction with respect to the front, which is the same as the angle of inclination of the first actual inclined line M with respect to the left-right direction, is $\beta 1$. The angle of inclination of the second temporary direction with respect to the front, which is the same as the angle of inclination of the second temporary inclined line L with respect to the left-right direction, is $\alpha 2$. The angle of inclination of the second actual direction with respect to the front, which is the same as the angle of inclination of the second actual inclined line N with respect to the left-right direction, is $\beta 2$. Here, $\alpha 1 < \beta 1 < \alpha 2 < \beta 2$. Thus, the printing plate 12, which is conveyed forward after the position thereof in the first temporary direction has been determined, first abuts the right side positioning pin 48 and pivots. The printing plate 12 thereby abuts the pair of positioning pins 48, and the position of the printing plate 12 in the first actual direction is determined. Moreover, the printing plate 12, which is conveyed forward after the position thereof in the second temporary direction has been determined, first abuts the right side positioning pin 52 and pivots. The printing plate 12 thereby abuts the pair of positioning pins 52, and the position of the printing plate 12 in the second actual direction is determined.

In this way, the printing plate 12 is pivoted and abuts the pair of positioning pins 48 and the pair of positioning pins 52, and the printing plate 12 abuts the reference pin 36 due to the rightward component of force of the conveying force of the conveying roller 24. Therefore, the printing plate 12 can reliably be made to abut the pair of positioning pins 48 and the pair of positioning pins 52, and can reliably be made to abut the reference pin 36. The accuracy of positioning the printing plate 12 can thereby be improved.

Because $\beta 1 < \alpha 2$ as described above, the printing plate 12, which is conveyed forward after the position thereof in the first actual direction has been determined, first abuts the right side positioning pin 68 and pivots. The printing plate 12 thereby abuts the pair of positioning pins 68, and the position of the printing plate 12 in the second temporary direction is determined. Thus, the printing plate 12 can reliably abut the pair of positioning pins 68. The printing plate 12 can thereby even more reliably abut the pair of positioning pins 52, and the accuracy of positioning the printing plate 12 can reliably be improved.

Figure 6:
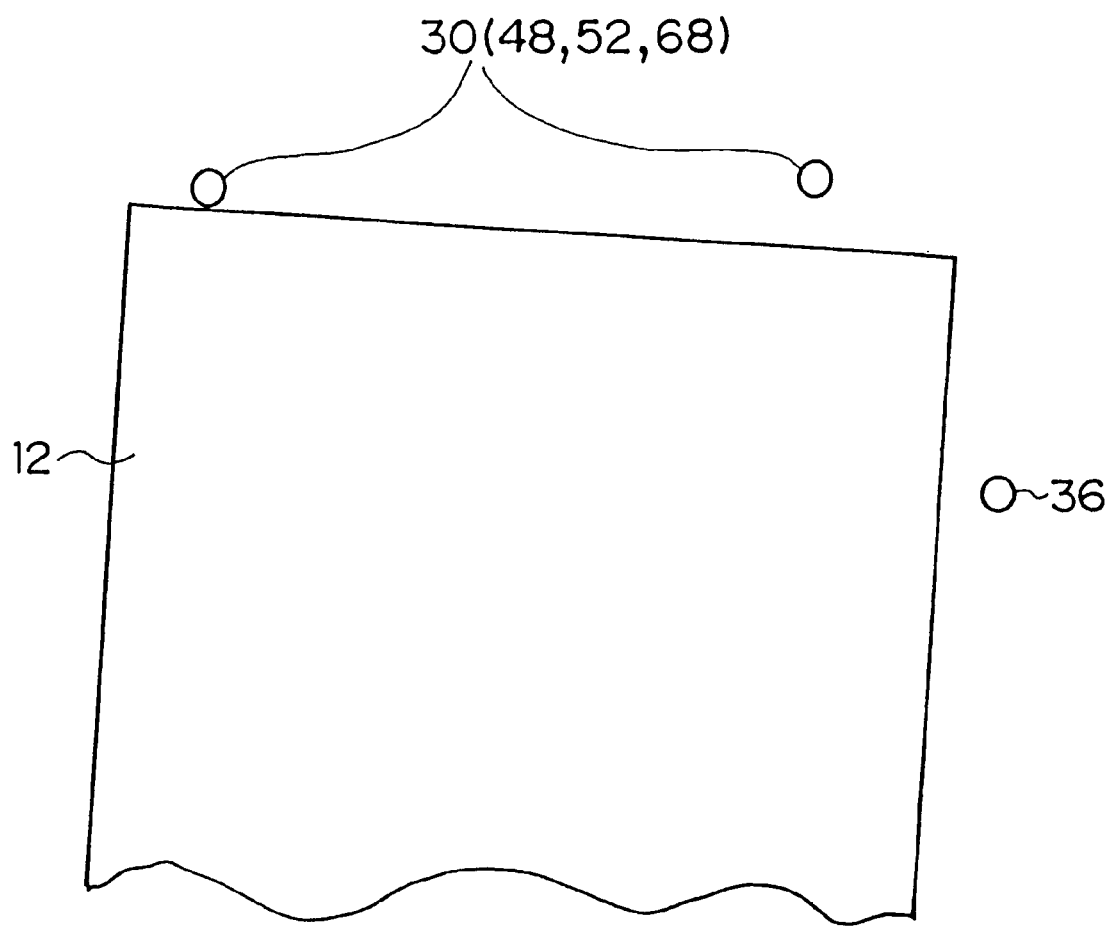
FIG. 6 is a plan view showing a state in which the printing plate moves apart from the right side positioning pin due to the reaction of abutting a left side positioning pin, in the automatic printing plate exposure device relating to the embodiment of the present invention.
Figure 7:
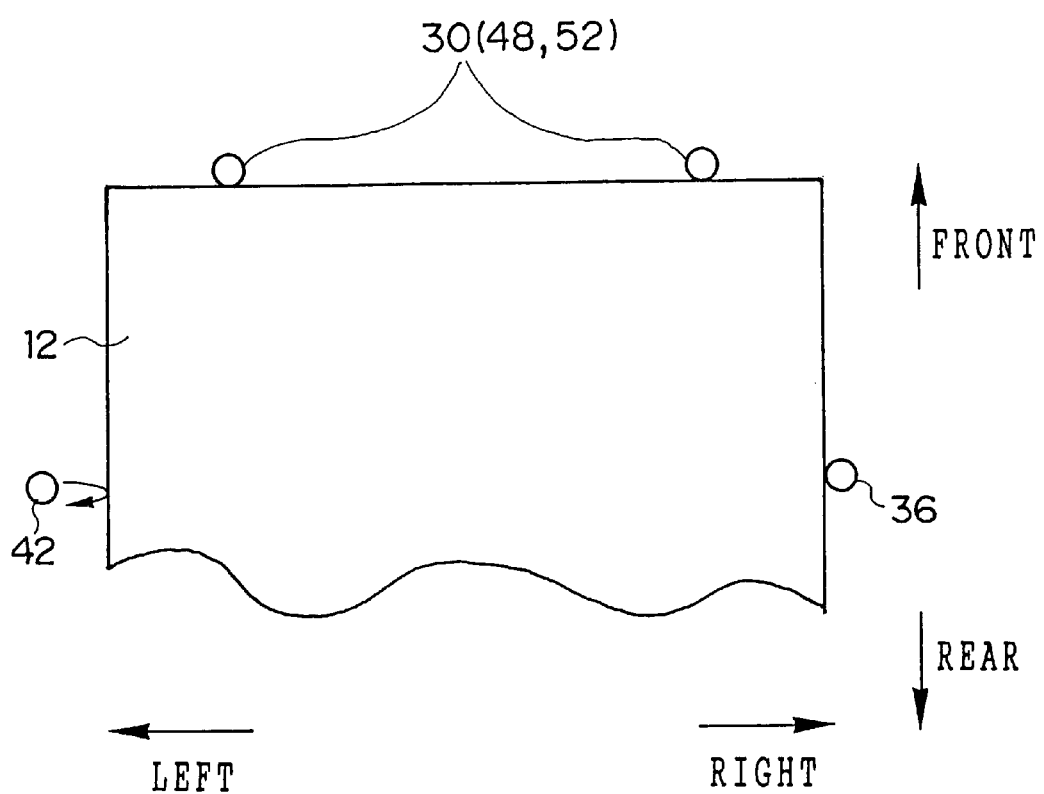
FIG. 7 is a plan view showing a state in which the printing plate is positioned in the automatic printing plate exposure device relating to the embodiment of the present invention.

The conveying speed of the printing plate 12, i.e., the rotating speed of the conveying roller 24, is lowered before the printing plate 12 abuts the left side positioning pins 30, 48, 52, 68. Thus, it is possible to suppress the moving away of the printing plate 12 from the right side positioning pins 30, 48, 52, 68 due to the reaction of the printing plate 12 abutting the left side positioning pins 30, 48, 52, 68 as shown in FIG. 6. In this way, the printing plate 12 can even more reliably abut the pairs of positioning pins 30, 48, 52, 68, and the accuracy of positioning the printing plate 12 can be improved even more. Note that, even in the case shown in FIG. 6 in which the printing plate 12 moves away from the right side positioning pins 30, 48, 52, 68, positioning can be carried out by a method of making the printing plate 12 again abut the pairs of positioning pins 30, 48, 52, 68 and the reference pin 36 by the conveying roller 24 and the conveying pin 42.

Further, there is no restraining of the printing plate 12, even if the printing plate 12 abuts the reference pin 36 and the pairs of positioning pins 30, 48, 52, 68 due to the conveying force of the conveying roller 24. Moreover, after the printing plate 12 abuts the reference pin 36, the conveying pin 42 moves away from the printing plate 12. Thus, the conveying pin 42 does not restrain the printing plate 12. In this way, buckling deformation of the printing plate 12 can be prevented, and the accuracy of positioning can be improved even more.

The position at which the printing plate 12, which is actually positioned at the punching section 16, abuts the pair of positioning pins 48 and the reference pin 36, and the position at which the printing plate 12, which is actually positioned at the exposure section 18, abuts the pair of positioning pins 52 and the reference pin 36, are the same position. Thus, even if there is curving at the end surfaces of the printing plate 12, the position at which the printing plate 12 is actually positioned in the punching section 16 (i.e., the position at which the printing plate 12 is positioned by the pair of positioning pins 48 and the reference pin 36) and the position at which the printing plate 12 is actually positioned in the exposure section 18 (i.e., the position at which the printing plate 12 is positioned by the pair of positioning pins 52 and the reference pin 36) can be made to correspond. Accordingly, the exposure position of the printing plate 12, namely the image recording position, can be made to correspond to the printing position of the printing plate 12 determined by the predetermined number of punch holes. Moreover, even if cut-outs are not formed in the printing plate 12 as they are in the conventional art, the aforementioned two positions (the position at which the printing plate 12 is actually positioned in the punching section 16 (the printing position) and the position at which the printing plate 12 is actually positioned in the exposure section 18 (the exposure position)) can be made to coincide with one another. Thus, a conventional, expensive cut-out forming device is unnecessary, and the device can be made less expensive, i.e., the manufacturing costs can be reduced.

In the present embodiment, $\alpha 1 < \beta 1 < \alpha 2 < \beta 2$. However, when $\alpha 1 = \alpha 2$ or the like, it suffices that $\alpha 1 < \beta 1$ and $\alpha 2 < \beta 2$.

Further, in the present embodiment, the pair of positioning pins 30 and the pair of positioning pins 68 may be disposed parallel to the left-right direction (i.e., it suffices that $\alpha 1 = \alpha 2 = 0$). In this case as well, by utilizing a structure in which the printing plate 12 is supplied to the plate supplying guide 20 in a state of being inclined with respect to the front-back direction, the printing plate 12, which is conveyed by the conveying force of the conveying roller 24, can abut either one of the pair of positioning pins 30 or either one of the pair of positioning pins 68 and be pivoted. Conveying force toward the right can be applied to the printing plate 12 due to the component of force toward the right (the other direction) of the conveying force of the conveying roller 24 such that the printing plate 12 can abut the reference pin 36.

In the present embodiment, a structure may be used in which the conveying pin 42, as well as the supporting shaft 40 and the slit 38, are not provided. In this case as well, conveying force toward the right can be applied to the printing plate 12 by the rightward (other direction) component of force of the conveying force of the conveying roller 24 such that the printing plate 12 can abut the reference pin 36. Further, because the printing plate conveying mechanism is only the conveying roller 24, the manufacturing costs can be reduced, and it is possible to utilize less space.

Moreover, in the present embodiment, a structure may be used in which the conveying pin 42 is moved toward the right (the other direction) at the time when the printing plate 12 is actually positioned in the punching section 16 or the exposure section 18.

In the present embodiment, a structure is used in which the rotating central shaft 24B of the skewer-type conveying roller 24 is inclined with respect to the right. However, a structure may be used in which the peripheral surface of the conveying roller is inclined by forming the conveying roller on the whole in a truncated cone shape, or by forming the respective roller portions of the skewer-type conveying roller in truncated cone shapes. In this case as well, conveying force toward the right can be applied to the printing plate (the sheet member) by the kinetic friction arising due to rotation of the conveying roller (the conveying force toward the right (the other direction) arising due to the inclination of the peripheral surface of the conveying roller). Moreover, it is possible to make the conveying roller be cylindrical on the whole and to provide a spiral conveying helix at the peripheral surface thereof, so as to make the conveying roller be a so-called spiral roller. In this case as well, conveying force toward the right can be applied to the printing plate (the sheet member) by the kinetic friction arising due to rotation of the conveying roller (the conveying force toward the right (the other direction) arising due to the rotation of the conveying helix).

In the present embodiment, the pairs of positioning pins 30, 48, 52, 68 are used as the first temporary abutment member, the second temporary abutment member, the first actual abutment member, and the second actual abutment member (i.e., as the temporary abutment members or the actual abutment members). However, a flat-plate-shaped positioning plate may be used as the first temporary abutment member, the second temporary abutment member, the first actual abutment member, and the second actual abutment member (the temporary abutment members or the actual abutment members).

In the present embodiment, one plate supplying guide 20 is provided, and the printing plate 12 is conveyed to the punching section 16 and the exposure section 18 from this plate supplying guide 20. However, a structure may be used in which two plate supplying guides (plates) are provided, and the printing plate (sheet member) is conveyed to and positioned at the punching section and the exposure section from the plate supplying guides respectively.

In the device for positioning a sheet member of the present invention, $\alpha < \beta$. Thus, the sheet member is pivoted and made to abut the actual abutment member at at least two points, the sheet member is made to abut the reference abutment member by the conveying force applying device, and the accuracy of positioning the sheet member can be improved.

In the device for positioning a sheet member of the present invention, the conveying device reduces the conveying speed of the sheet member before the sheet member abuts at least one of the temporary positioning member and the actual positioning member. Thus, the moving away of the sheet member from the temporary abutment member or the actual abutment member due to the reaction of the sheet member abutting the temporary abutment member or the actual abutment member can be suppressed, and the precision of positioning the sheet member can be improved even more.

In the device for positioning a sheet member of the present invention, $\alpha 1 < \beta 1 < \alpha 2 < \beta 2$, or $\alpha 1 < \beta 1$ and $\alpha 2 < \beta 2$. Thus, the sheet member can be pivoted and can abut the first actual positioning member and the second actual positioning member at at least two points. Moreover, the sheet member can abut the reference abutment member by the conveying force applying device. Thus, the accuracy of positioning the sheet member can be improved.

In the device for positioning a sheet member of the present invention, the conveying device reduces the conveying speed of the sheet member before the sheet member abuts at least one of the first temporary abutment member, the first actual abutment member, the second temporary abutment member, and the second actual abutment member. Thus, the moving away of the sheet member from the first temporary abutment member, the first actual abutment member, the second temporary abutment member, or the second actual abutment member due to the reaction of the sheet member abutting at least one thereof can be suppressed, and the accuracy of positioning the sheet member can be improved even more.

In the device for positioning a sheet member of the present invention, because the conveying member pushes the sheet member and conveys the sheet member in the other direction, the sheet member can be reliably conveyed in the other direction. Further, after the sheet member abuts the reference abutment member, the conveying member moves away from the sheet member. Thus, the conveying member does not restrain the sheet member, and the positioning accuracy can be improved even more.

In the device for positioning a sheet member of the present invention, the position where the sheet member abuts the first actual abutment member at at least two points and abuts the reference abutment member, and the position where the sheet member abuts the second actual abutment member at at least two points and abuts the reference abutment member, are the same position. Thus, even if the side surfaces of the sheet member are curved, the position, at which the sheet member is positioned by the first abutment member and the reference abutment member, and the position, at which the sheet member is positioned by the second abutment member and the reference abutment member, can be made to coincide. Further, these two positions at which the sheet member is positioned can be made to coincide without forming cut-outs in the sheet member as in the conventional art. Thus, a conventional, expensive cut-out forming device is not needed, and the device can be made less expensive.

Next, another embodiment of the present invention will be described. Description will be omitted of members which are also used in the previously-described embodiment.

In this other embodiment of the present invention, the rotating central shaft 24B of the conveying roller 24 is disposed parallel to the left-right direction. By driving and rotating the conveying roller 24, the printing plate 12 placed on the plate supplying guide 20 can be conveyed forward in a predetermined direction.

Figure 8:
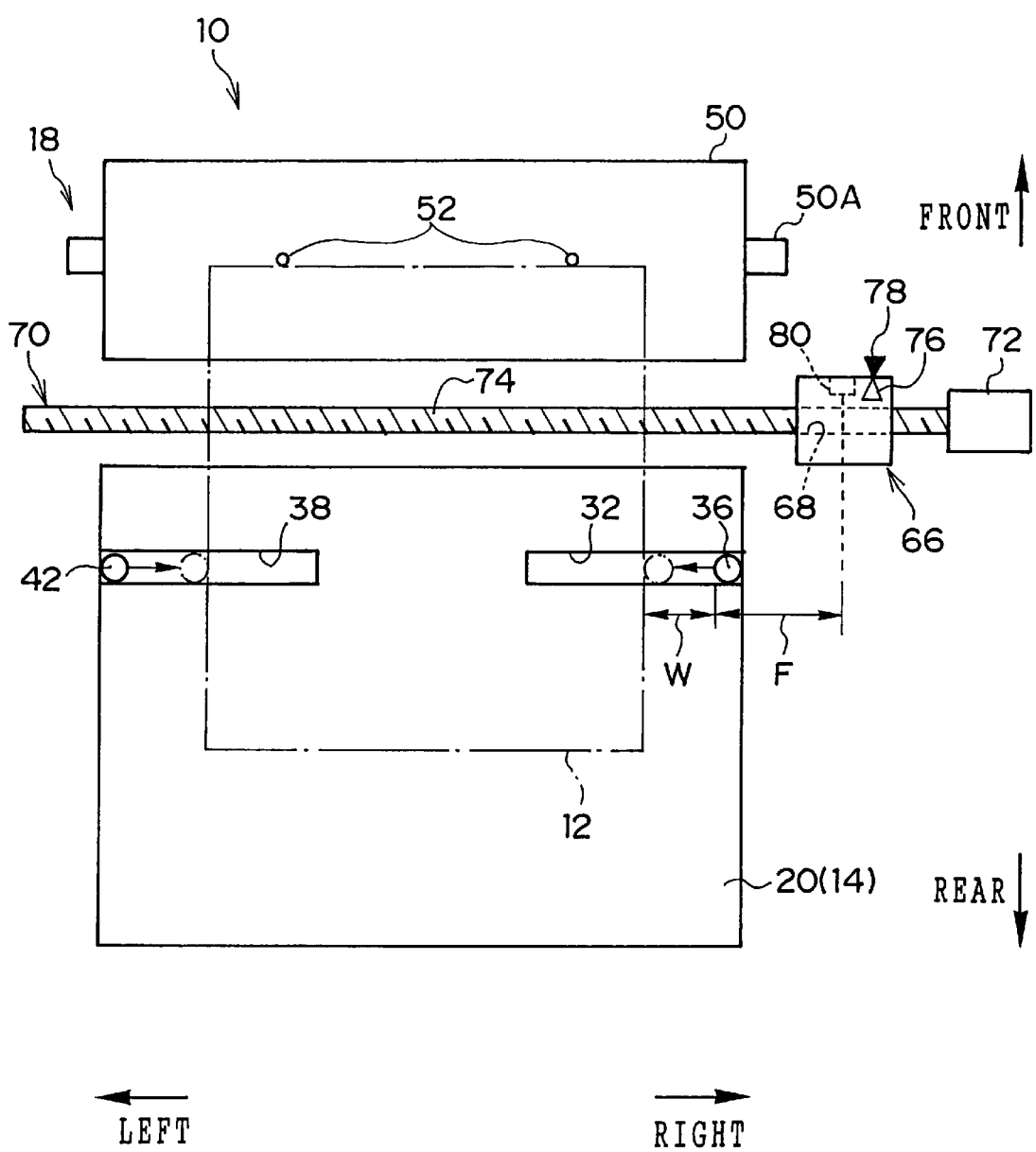
FIG. 8 is a schematic plan view showing main portions of the automatic printing plate exposure device relating to the embodiment of the present invention.

As shown in FIG. 8, the recording head portion 66 serving as the image recording section is disposed in a vicinity of the rear side of the peripheral surface of the rotating drum 50. A female screw 68 is formed at the recording head portion 66. A shaft 70 is disposed along the axial direction of the rotating drum 50 (the left-right direction) in a vicinity of the rear side of the peripheral surface of the rotating drum 50. A pulse motor 72 is connected to one end of the shaft 70. The shaft 70 can rotate due to driving of the pulse motor 72. In the present embodiment, the right end of the shaft 70 is used as the aforementioned one end, and a stepping motor is used as the pulse motor 72. A male screw 74 which is a ball screw is formed on the outer periphery of the shaft 70. The female screw 68 of the recording head portion 66 screws together with the male screw 74, and the recording head portion 66 is supported in a state in which it stands erect at the shaft 70. Here, due to the pulse motor 72 being driven and the shaft 70 being rotated, the recording head portion 66 moves along the axial direction of the rotating drum 50 while the state, in which the recording head portion 66 stands erect with respect to the shaft 70, is maintained.

An origin position detecting sensor 76 is provided at the recording head portion 66. When the origin position detecting sensor 76 detects an origin mark 78 disposed at a predetermined position in a vicinity of the rotating drum 50, the recording head portion 66 is disposed at the origin position, i.e., its initial position.

Here, synchronously with the rotation of the rotating drum 50, the recording head portion 66 irradiates, from an irradiating lens 80, a light beam, which is modulated on the basis of read image data, toward the rotating drum 50 which is rotating at high speed as described above. In this way, the printing plate 12 is exposed on the basis of the image data. This exposure processing is scanning exposure.

At this time, the image recording start position of the printing plate 12 is determined by making the initial moving distance of the recording head portion 66 toward the left from the origin position be W+F, where W is the distance which the reference pin 36 has moved toward the left from its starting point position (the right end portion of the plate supplying guide 20) for positioning, and F is the offset amount toward the right of the irradiating lens 80 of the recording head portion 66, which is disposed at the origin position, with respect to the reference pin 36 disposed at the starting point position.

Further, the rotational position of the rotating drum 50 is judged by computing rotational position data by an encoder (not shown) disposed on the rotating shaft 50A of the rotating drum 50.

Next, operation of this other embodiment will be described.

The position, at which the printing plate 12 abuts the pair of positioning pins 48 and the reference pin 36 at the time when the printing plate 12 is actually positioned in the punching section 16, and the position, at which the printing plate 12 abuts the pair of positioning pins 52 and the reference pin 36 at the time when the printing plate 12 is actually positioned in the exposure section 18, are the same position. Thus, even if the end surfaces of the printing plate 12 are curved, the position at which the printing plate 12 is actually positioned in the punching section 16 and the position at which the printing plate 12 is actually positioned in the exposure section 18 can be made to coincide with one another. The exposure position of the printing plate 12 (the image recording position) can be made to coincide with the printing position of the printing plate 12 determined by the predetermined number of punch holes.

Moreover, the position at which the printing plate 12 is actually positioned in the punching section 16 (i.e., the printing position) and the position at which the printing plate 12 is actually positioned in the exposure section 18 (i.e., the exposure position) can be made to coincide with one another, even if cut-outs are not formed in the printing plate 12 as they are in the conventional art. Thus, the conventional, expensive cut-out forming device is not needed, and the device can be made to be less expensive.

Figure 9:
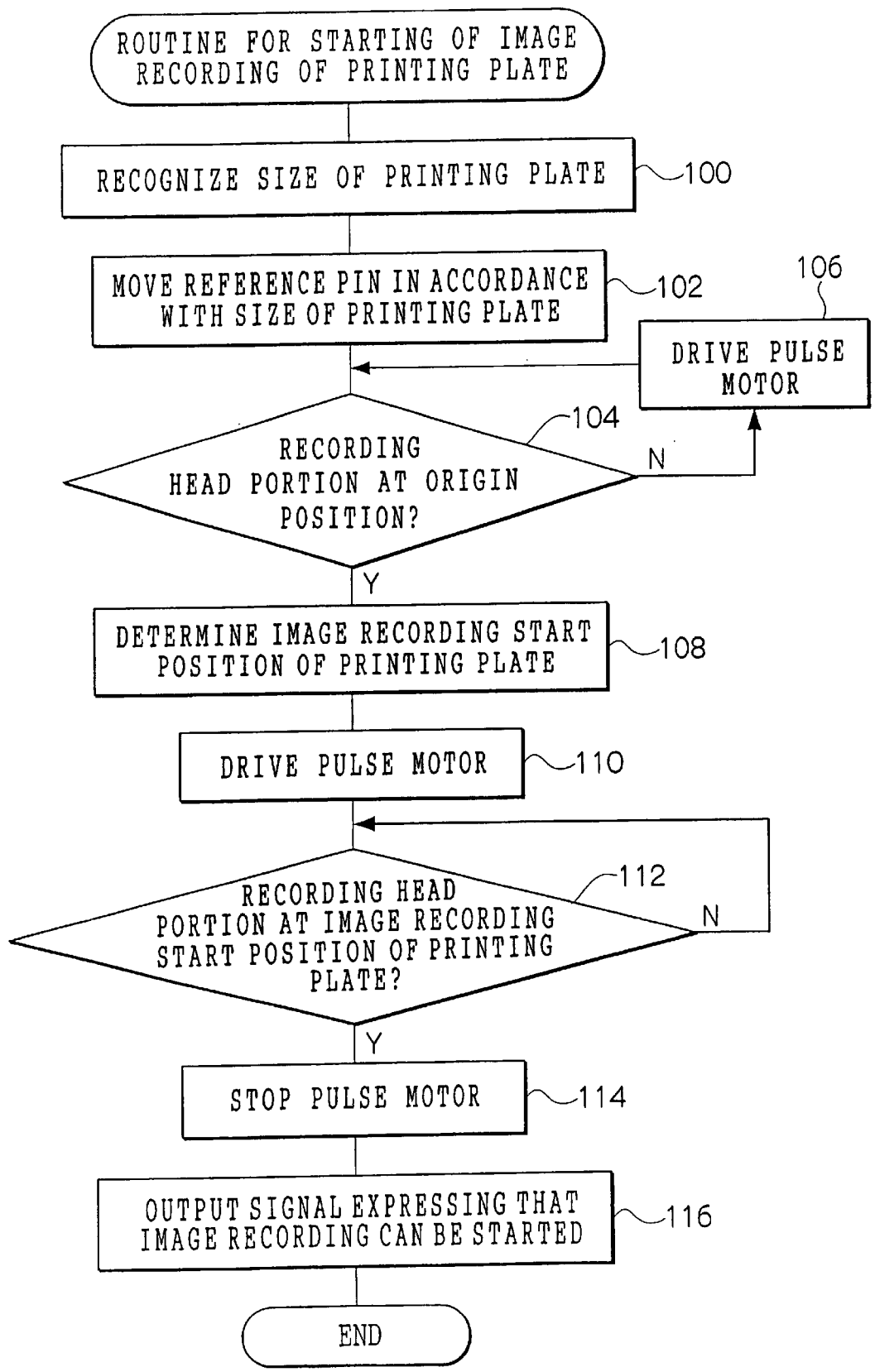
FIG. 9 is a flowchart showing an image recording starting routine for the printing plate in the automatic printing plate exposure device relating to the embodiment of the present invention.

Next, a routine of starting image recording of the printing plate 12 will be described in accordance with the flowchart of FIG. 9.

First, when the size of the printing plate 12 placed on the plate supplying guide 20 is confirmed in step 100, in step 102, the reference pin 36 is moved toward the left from its starting point position in accordance with the size of the printing plate 12 which was recognized in step 100. Then, in step 104, a determination is made as to whether the recording head portion 66 is disposed at the origin position.

When it is judged in step 104 that the recording head portion 66 is not disposed at the origin position, in step 106, the pulse motor 72 is driven and the recording head portion 66 is moved. It is then again judged in step 104 whether or not the recording head portion 66 is disposed at the origin position.

On the other hand, when it is judged in step 104 that the recording head portion 66 is disposed at the origin position, in step 108, the image recording start position of the printing plate 12 is determined by computing the initial moving distance (W+F) of the recording head portion 66 toward the left from the origin position, by adding the moving distance W of the reference pin 36 toward the left from the starting point position in step 102, and the offset amount F, toward the right, of the irradiating lens 80 of the recording head portion 66 disposed at the origin position, with respect to the reference pin 36 disposed at the starting point position.

Thereafter, in step 110, the pulse motor 72 is driven, and the recording head portion 66 is moved toward the left. In step 112, a determination is made as to whether the recording head portion 66 is disposed at the image recording start position of the printing plate 12.

When it is judged in step 112 that the recording head portion 66 is not disposed at the image recording start position of the printing plate 12, driving of the pulse motor 72 is continued, and the recording head portion 66 is moved. It is again judged in step 112 whether or not the recording head portion 66 is positioned at the image recording start position of the printing plate 12.

On the other hand, when it is judged in step 112 that the recording head portion 66 is disposed at the image recording starting position of the printing plate 12, in step 114, the driving of the pulse motor 72 is stopped and the movement of the recording head portion 66 is stopped. In step 116, a signal expressing that the start of image recording of the printing plate 12 is possible is outputted, and the image recording start routine of the printing plate 12 is completed.

In this way, the image recording start position of the printing plate 12 is determined by computing the initial moving distance of the recording head portion 66 from its origin position, in accordance with the distance which the reference pin 36 has moved from its starting point position in accordance with the size of the printing plate 12. Thus, the position at which image recording of the printing plate 12 is to be started can be determined accurately.

In the present embodiment, the pairs of positioning pins 30, 48, 52 are disposed parallel to the left-right direction. However, a structure may be used in which the pairs of positioning pins are not disposed parallel to the left-right direction (the axial direction of the rotating drum).

Moreover, in the present embodiment, the pairs of positioning pins 30, 48, 52 are used as the first abutment member, the second abutment member and the like. However, instead, a flat-plate-shaped positioning plate may be used as the first abutment member, the second abutment member and the like.

The present embodiment may utilize a structure in which the conveying pin 42 is not moved at the time of temporarily positioning the printing plate 12. In this case as well, the printing plate 12 can be made by the conveying pin 42 to abut the reference pin 36 at the time when the printing plate 12 is actually positioned in the punching section 16 or the exposure section 18.

In the present embodiment, one plate supplying guide 20 is provided, and the printing plate 12 is conveyed to the punching section 16 and the exposure section 18 from this plate supplying guide 20. However, a structure may be used in which two plate supplying guides (plates) are provided, and the printing plate (sheet member) is conveyed to and positioned at the punching section and the exposure section from the plate supplying guides respectively.

In the device for positioning a sheet member of the present invention, the position, at which the sheet member abuts the first abutment member at at least two points and abuts the third abutment member, and the position, at which the sheet member abuts the second abutment member at at least two points and abuts the third abutment member, are the same position. Therefore, even if there is curving of the end surfaces of the sheet member, the position, at which the sheet member is positioned by the first abutment member and the third abutment member, and the position, at which the sheet member is positioned by the second abutment member and the third abutment member, can be made to coincide. Moreover, even if cut-outs are not formed in the sheet member as they are in the conventional art, the aforementioned two positions at which the sheet member is positioned can be made to coincide with one another. Thus, the conventional, expensive cut-out forming device is not needed, and the device can be made to be low cost.

In the image recording device of the present invention, the position, at which the printing plate abuts the first abutment member at at least two points and abuts the third abutment member, and the position, at which the printing plate abuts the second abutment member at at least two points and abuts the third abutment member, are the same position. Therefore, even if there is curving of the end surfaces of the printing plate, the position, at which the printing plate is positioned by the first abutment member and the third abutment member, and the position, at which the printing plate is positioned by the second abutment member and the third abutment member, can be made to coincide. Moreover, even if cut-outs are not formed in the printing plate as they are in the conventional art, the aforementioned two positions at which the printing plate is positioned can be made to coincide with one another. Thus, the conventional, expensive cut-out forming device is not needed, and the device can be made to be low cost. Further, the image recording start position of the printing plate is determined by computing the initial moving distance of the image recording section from its origin position, in accordance with the distance which the third abutment member has moved from its starting point position in accordance with the size of the printing plate. Thus, the position at which image recording of the printing plate starts can be accurately determined.

In the image recording device, punch holes are formed in the printing plate which is positioned by the first abutment member and the third abutment member. Thus, the image recording position of the printing plate can be made to coincide with the printing position of the printing plate determined by the punch holes.

What is claimed is:

1. A device for positioning a sheet member, the device comprising:
   a generally flat plate on which the sheet member is received;
   a conveying device provided so as to correspond to the sheet member received on the plate, and conveying the sheet member in one direction;
   a temporary abutment member provided at a side of the plate in the one direction, and due to the sheet member, being conveyed in the one direction, the sheet member abutting the temporary abutment member at at least two points, which determines a position of the sheet member in a temporary direction;
   an actual abutment member provided at said side of the plate, and due to the sheet member being conveyed in the one direction after the position in the temporary direction has been determined, the sheet member abutting the actual abutment member at at least two points, which determines a position of the sheet member in an actual direction;
   a conveying force applying device applying a conveying force to the sheet member in another direction substantially orthogonal to the one direction, to the sheet member; and
   a reference abutment member provided at another side of the plate in that another direction, and due to the conveying force in said another direction being applied to the sheet member, the sheet member abutting the reference abutment member, which determines a position of the sheet member in said another direction,
   wherein an angle of inclination of the temporary direction with respect to the one direction is $\alpha$, and an angle of inclination of the actual direction with respect to the one direction is $\beta$, $\alpha<\beta$.

2. The device of claim 1, wherein, before the sheet member abuts at least one of the temporary abutment member and the actual abutment member, the conveying device reduces conveying speed of the sheet member.

3. The device of claim 1, further comprising a conveying member provided at a side of the plate, in a direction orthogonal to the temporary direction, and due to the conveying member movement, the conveying member pushes the sheet member and conveys the sheet member in said another direction, and after the sheet member abuts the reference abutment member, the conveying member moves away from the sheet member.

4. The device of claim 1, wherein the temporary abutment member and the actual abutment member each comprise a pair of positioning pins, and the pair of positioning pins and the reference abutment member each comprise a shaft and a cylinder substantially freely rotatable around the shaft.

5. A device for positioning a sheet member, the device comprising:
   a generally flat plate on which a sheet member is received;
   a conveying device provided so as to correspond to the sheet member received on the plate, and conveying the sheet member in one direction;
   a first temporary abutment member provided at a side of the plate in the one direction, and due to the sheet member being conveyed in the one direction, the sheet member abutting the first temporary abutment member at at least two points, which determines a position of the sheet member in a first temporary direction;
   a first actual abutment member provided at said side of the plate, and due to the sheet member being conveyed in the one direction after the position in the first temporary direction has been determined, the sheet member abutting the first actual abutment member at at least two points, which determines a position of the sheet member in a first actual direction;
   a second temporary abutment member provided at said side of the plate, and due to the sheet member being conveyed in the one direction after the position in the first actual direction has been determined, the sheet member abutting the second temporary abutment member at at least two points, which determines a position of the sheet member in a second temporary direction;
   a second actual abutment member provided at said side of the plate, and due to the sheet member, which is being conveyed in the one direction after the position in the second temporary direction has been determined, the sheet member abutting the second actual abutment member at at least two points, which determines a position of the sheet member in a second actual direction;
   a conveying force applying device applying a conveying force to the sheet member in another direction, substantially orthogonal to the one direction; and
   a reference abutment member provided at another side of the plate in said another direction, and due to the conveying force in said another direction being applied to the sheet member, the sheet member abutting the reference abutment member, which determines a position of the sheet member in said another direction,
   wherein given that an angle of inclination of the first temporary direction with respect to the one direction is $\alpha 1$, an angle of inclination of the first actual direction with respect to the one direction is $\beta 1$, an angle of inclination of the second temporary direction with respect to the one direction is $\alpha 2$, and an angle of inclination of the second actual direction with respect to the one direction is $\beta 2$, when $\alpha 1 \ne \alpha 2$, $\alpha 1<\beta 1<\alpha 2<\beta 2$, and when $\alpha 1=\alpha 2$, $\alpha 1<\beta 1$ and $\alpha 2<\beta 2$.

6. The device of claim 5, wherein, before the sheet member abuts at least one of the first temporary abutment member, the first actual abutment member, the second temporary abutment member, and the second actual abutment member, the conveying device reduces a conveying speed of the sheet member.

7. The device of claim 5, wherein a position at which the sheet member abuts the first actual abutment member at at least two points and abuts the reference abutment member, is substantially the same as where the sheet member abuts the second actual abutment member at at least two points and abuts the reference abutment member.

8. The device of claim 5, wherein the first temporary abutment member, the second temporary abutment member, the first actual abutment member, and the second actual abutment member each comprise a pair of positioning pins, and the pair of positioning pins and the reference abutment member each comprise a shaft and a cylinder substantially freely rotatable around the shaft.

9. The device of claim 6, further comprising a conveying member provided at a side of the plate, in a direction substantially orthogonal to the temporary direction, and due to conveying member movement, the conveying member pushes the sheet member and conveys the sheet member in said another direction, and after the sheet member abuts the reference abutment member, the conveying member moves away from the sheet member.

10. A device for positioning a sheet member, the device comprising:

a generally flat plate on which the sheet member is received;

a first conveying device provided so as to correspond to the sheet member received on the plate, and conveying the sheet member in a predetermined direction;

a first abutment member provided at a side of the plate, in the predetermined direction, and due to the sheet member being conveyed in the predetermined direction, the sheet member abutting the first abutment member at at least two points, which determines a position of the sheet member in a first direction;

a second abutment member provided at said side of the plate, and due to the sheet member being conveyed in the predetermined direction, abutting the second abutment member at at least two points, which determines a position of the sheet member in a second direction;

a second conveying device which, when the sheet member abuts the first abutment member, conveys the sheet member in a third direction substantially orthogonal to the first direction, and which, when the sheet member abuts the second abutment member, conveys the sheet member in a fourth direction substantially orthogonal to the second direction; and a third abutment member provided at sides of the plate, in the third direction and the fourth direction, and due to the sheet member being conveyed in one of the third direction and the fourth direction, the sheet member abutting the third abutment member, which determines a position of the sheet member in one of the third direction and the fourth direction, wherein a position at which the sheet member abuts the first abutment member at at least two points and abuts the third abutment member, and a position at which the sheet member abuts the second abutment member at at least two points and abuts the third abutment member, are substantially the same position.

11. The device of claim 10, wherein the first abutment member and the second abutment member each comprise a pair of positioning pins, and the pair of positioning pins and the third abutment member each comprise a shaft and a cylinder substantially rotatable around the shaft.

12. An image recording device comprising:

a generally flat plate on which a printing plate is received;

a first conveying device provided so as to correspond to the printing plate received on the plate, and conveying the printing plate in a predetermined direction;

a first abutment member provided at a side of the plate, in the predetermined direction, and due to the printing plate being conveyed in the predetermined direction, the printing plate abutting the first abutment member at at least two points, which determines a position of the printing plate in a first direction;

a second abutment member provided at said side of the plate, and due to the printing plate being conveyed in the predetermined direction, the printing plate abutting the second abutment member at at least two points, which determines a position of the printing plate in a second direction;

a second conveying device which, when the printing plate abuts the first abutment member, conveys the printing plate in a third direction substantially orthogonal to the first direction, and which, when the printing plate abuts the second abutment member, conveys the printing plate in a fourth direction substantially orthogonal to the second direction;

a third abutment member provided at sides of the plate, in the third direction and the fourth direction, and due to the printing plate being conveyed in one of the third direction and the fourth direction, abutting the third abutment member after the third abutment member has moved from a starting point position in accordance with a size of the printing plate, which determines a position of the printing plate in one of the third direction and the fourth direction; and an image recording section provided so as to be movable from an origin position, and recording an image on the printing plate which has been positioned by abutting the second abutment member at at least two points and by abutting the third abutment member, wherein a position at which the printing plate abuts the first abutment member at at least two points and abuts the third abutment member, is substantially the same as where the printing plate abuts the second abutment member at at least two points and abuts the third abutment member, and an image recording start position of the printing plate is determined by computing an initial movement distance of the image recording section from the origin position, in accordance with a distance which the third abutment member has moved from the starting point position in accordance with the size of the printing plate.

13. The device of claim 12, wherein punch holes are formed in the printing plate after the printing plate has been positioned by abutting the first abutment member at at least two points and by abutting the third abutment member wherein the punch holes are used in positioning for printing processing of the printing plate.

14. The image recording device of claim 12, wherein the first abutment member and the second abutment member each comprise a pair of positioning pins, and the pair of positioning pins and the third abutment member each comprise a shaft and a cylinder substantially freely rotatable around the shaft.

* * * * *